(12) United States Patent
     Reichardt et al.

(10) Patent No.: US 10,899,945 B2
(45) Date of Patent: Jan. 26, 2021

(54) USE OF A CHEMICAL MECHANICAL POLISHING (CMP) COMPOSITION FOR POLISHING OF COBALT COMPRISING SUBSTRATES

(71) Applicant: BASF SE, Ludwigshafen (DE)

(72) Inventors: Robert Reichardt, Ludwigshafen am Rhein (DE); Max Siebert, Ludwigshafen (DE); Yongqing Lan, Ludwigshafen (DE); Michael Lauter, Mannheim (DE); Sheik Ansar Usman Ibrahim, Heverlee (BE); Reza M. Golzarian, Portland, OR (US); Te Yu Wei, Taoyuan (TW); Haci Osman Guevenc, Heidelberg (DE); Julian Proelss, Worms (DE); Leonardus Leunissen, Ludwigshafen (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/751,612

(22) PCT Filed: Aug. 9, 2016

(86) PCT No.: PCT/EP2016/068964
    § 371 (c)(1),
    (2) Date: Feb. 9, 2018

(87) PCT Pub. No.: WO2017/025536
     PCT Pub. Date: Feb. 16, 2017

(65) Prior Publication Data
     US 2018/0230333 A1    Aug. 16, 2018

Related U.S. Application Data

(60) Provisional application No. 62/203,940, filed on Aug. 12, 2015.

(51) Int. Cl.
    *C09G 1/02* (2006.01)
    *C09G 1/04* (2006.01)
    (Continued)

(52) U.S. Cl.
    CPC ............... *C09G 1/02* (2013.01); *C09G 1/04* (2013.01); *C09K 3/1409* (2013.01);
    (Continued)

(58) Field of Classification Search
    None
    See application file for complete search history.

(56) References Cited

U.S. PATENT DOCUMENTS 5,230,833 A   7/1993  Romberger et al.
6,840,971 B2  1/2005  Wang et al.
              (Continued)

FOREIGN PATENT DOCUMENTS

CN   102888208 A   1/2013
CN   107109132 A   8/2017
              (Continued)

OTHER PUBLICATIONS

Kuntzsch, T., et al., "Characterization of Slurries Used for Chemical-Mechanical Polishing (CMP) in the Semiconductor Industry", Chemical Engineering & Technology, vol. 26 No. 12, 2003, pp. 1235-1239.
(Continued)

*Primary Examiner* — Jiong-Ping Lu
(74) *Attorney, Agent, or Firm* — Oblon, McClelland, Maier & Neustadt, L.L.P.

(57) ABSTRACT

Use of a chemical mechanical polishing (CMP) composition (Q) for chemical mechanical polishing of a substrate (S) comprising (i) cobalt and/or (ii) a cobalt alloy and (iii) Ti N and/or TaN, wherein the CMP composition (Q) comprises (E) Inorganic particles (F) at least one organic compound
(Continued)

comprising an amino-group and an acid group (Y), wherein said compound comprises n amino groups and at least n+1 acidic protons, wherein n is a integer$\geq 1$. (G) at least one oxidizer in an amount of from 0.2 to 2.5 wt.-% based on the total weight of the respective CMP composition, (H) an aqueous medium wherein the CMP composition (Q) has a pH of more than 6 and less than 9.

20 Claims, 3 Drawing Sheets

(51) Int. Cl.
    *C09K 3/14*      (2006.01)
    *H01L 21/306*      (2006.01)
    *H01L 21/321*      (2006.01)
    *H01L 21/461*      (2006.01)

(52) U.S. Cl.
    CPC ...... *C09K 3/1463* (2013.01); *H01L 21/30625* (2013.01); *H01L 21/3212* (2013.01); *H01L 21/461* (2013.01)

(56) References Cited

U.S. PATENT DOCUMENTS

| | | |
|---|---|---|
| 2003/0166337 A1 | 9/2003 | Wang et al. |
| 2004/0175942 A1 | 9/2004 | Chang et al. |
| 2005/0148187 A1 | 7/2005 | Wang et al. |
| 2007/0254485 A1* | 11/2007 | Mao ................. B23H 5/08 438/692 |
| 2008/0148649 A1 | 6/2008 | Liu |
| 2008/0242090 A1* | 10/2008 | Yamada ............. C09G 1/02 438/692 |
| 2008/0254629 A1 | 10/2008 | Chang et al. |
| 2011/0059680 A1* | 3/2011 | Motonari ........... C09G 1/02 451/36 |
| 2014/0011361 A1 | 1/2014 | Reichardt et al. |
| 2016/0027657 A1* | 1/2016 | Shi ................... C09G 1/02 438/693 |
| 2016/0079084 A1 | 3/2016 | Chang et al. |
| 2018/0215952 A1* | 8/2018 | Onishi ............... B24B 37/00 |

FOREIGN PATENT DOCUMENTS

| | | |
|---|---|---|
| CN | 107109133 A | 8/2017 |
| CN | 107109134 A | 8/2017 |
| EP | 1 218 454 | 7/2001 |
| EP | 1 218 464 | 7/2002 |
| JP | 2009-087968 A | 4/2009 |
| TW | 201002806 A | 1/2010 |
| WO | 2004/063301 A1 | 7/2004 |

OTHER PUBLICATIONS

International Search Report dated Nov. 11, 2016, in PCT/EP2016/068964, filed Aug. 9, 2016.

* cited by examiner

USE OF A CHEMICAL MECHANICAL POLISHING (CMP) COMPOSITION FOR POLISHING OF COBALT COMPRISING SUBSTRATES

BACKGROUND

Technical Field

This invention essentially relates to the use of a chemical mechanical polishing (CMP) composition comprising inorganic particles, at least one organic compound comprising an amino-group and an acid group (Y), wherein said compound comprises n amino groups and at least n+1 acidic protons, wherein n is a integer ≥1, at least one oxidizer and an aqueous medium for polishing substrates of the semiconductor industry comprising cobalt and/or a cobalt alloy and TiN and/or TaN. The present invention also relates to a process for the manufacture of semiconductor devices comprising the chemical-mechanical polishing of a substrate or layer in the presence of said chemical-mechanical polishing (CMP) composition. The CMP composition shows both namely an improved material removal rate (MRR) of cobalt and TiN and/or TaN and a low etching rate with regard to Co.

Related Art

In the semiconductor industry, chemical mechanical polishing (abbreviated as CMP) is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

With the continuous shrink of feature size in ultra large scale integrated Circuits (ULSI) technology, the size of the copper interconnect structure is getting smaller and smaller. To reduce the RC delay, the thickness of barrier or adhesion layer in the copper interconnect structure is getting thinner. The traditional copper barrier/adhesion layer stack Ta/TaN is not suitable any more, as the resistivity of Ta is relatively high and copper cannot be directly electroplated onto Ta. Compared with Ta, cobalt has lower resistivity and is cheaper. The adhesion between Cu and Co is good. Cu can easily nucleate on Co, also copper can be directly electroplated on cobalt.

In integrated circuits, Co is used as adhesion or barrier layer for copper interconnects, while Co can also be used as nano-crystalline Co in memory device and as metal gate in MOSFET.

Porous low k dielectrics material has been already used in the current interconnect structures. It is reported that low k material can be easily damaged by plasma or polishing slurries. In current chemical mechanical polishing processing, to reduce the damage to low-k dielectrics, most of the current slurries used for copper and barriers are acidic. But it is observed that copper and cobalt easily suffered from dissolution in acidic solution containing oxidant for example hydrogen peroxide. This makes the polishing rate of copper and cobalt too high so that it will induce the dishing of copper lines. In addition the dissolution of the cobalt adhesion layer on the sidewall of the copper interconnect structure can lead to the delamination of copper lines and cause reliability problems.

Another application of Cobalt in semiconductor chip manufacturing is the deposition of cobalt by CVD or PVD methods into trenches or vias. The dielectric layer is covered by a liner to make sure that the Co will not delaminate or diffuse into the dielectric layer. As liner and/or barrier a layer of Ti/TiN and/or Ta/TaN can be used.

For damascene like CMP of Co-coated wafers it is good to remove Co and the liner in one step. So a high removal rate for Co and Ti/TiN and/or Ta/TaN is advantageous. On the other hand the dielectric layer should not be damaged, so a low rate for this type of material is required.

This coexistence of Co, Cu, low k dielectric materials, Ti/TiN and/or Ta/TaN in different amounts and layer thickness depending on the used integration scheme in ultra large scale integrated Circuits (ULSI) technology gives up multiple challenges, in terms of selectivity, corrosion, removal rates and surface quality, to the compositions used for chemical mechanical polishing in the production of semiconductor devices.

In the state of the art, the use of CMP compositions comprising inorganic particles, at least one organic compound comprising an amino-group and an acid group (Y), wherein said compound comprises n amino groups and at least n+1 acidic protons, wherein n is a integer≥1, an oxidizer and an aqueous medium for polishing substrates of the semiconductor industry comprising metal and Ti/TiN and/or Ta/TaN are known and described, for instance, in the following reference.

U.S. Pat. No. 6,840,971 B2 discloses an alpha-amino acid containing chemical mechanical polishing compositions and slurries that are useful for polishing substrates including multiple layers of metals, or metals and dielectrics, for example Cu/TiN/Ti and Cu/TaN/Ta multi-layer substrates. Beside the alpha-amino acid the slurry comprises abrasive particles, oxidizer and optionally further ingredients including passivation film forming agents, dispersants, surfactants, polishing stopping compounds and stabilizers. Especially useful for polishing substrates including copper, titanium, titanium nitride, tantalum, tantalum nitride, tungsten, and tungsten nitride layers at good rates under controllable conditions.

Consequently, it would be highly desirable to have a use of a CMP composition and a CMP process at hand which could avoid all the disadvantages associated with the prior art, for example focus on copper and tungsten, low material removal rate of Ta, acidic pH associated with corrosion problems of the to be polished metal.

BRIEF SUMMARY OF THE DISCLOSURE

One of the objects of the present invention was to provide the use of a CMP composition appropriate for the chemical mechanical polishing of substrates comprising cobalt and/or a cobalt alloy and TiN and/or TaN and showing an improved polishing performance, particularly a high Co material removal rate combined with a high material removal rate of TiN and/or TaN and a controllable and adjustable material removal rate of cobalt and/or cobalt alloy and TiN and/or TaN. Furthermore, the use of a CMP composition was sought that leads not only to high material removal rates of cobalt and/or cobalt alloy and TiN and/or TaN, but also is compatible with the low k dielectric materials and other metals for example copper and showing low material removal rates for silicon oxide leading to good cobalt to silicon oxide selectivities. In addition it gives a high quality surface finish, decreases dishing, is storage stable and would be ready-to-use in neutral to alkaline pH range.

Furthermore, a respective CMP process was to be provided.

Accordingly, the use of a chemical mechanical polishing (CMP) composition (Q) for chemical mechanical polishing of a substrate (S) comprising (i) cobalt and/or (ii) a cobalt alloy and (iii) TiN and/or TaN, wherein the CMP composition (Q) comprises
(A) Inorganic particles
(B) at least one organic compound comprising an aminogroup and an acid group (Y), wherein said compound comprises n amino groups and at least n+1 acidic protons, wherein n is a integer≥1.
(C) at least one oxidizer in an amount of from 0.2 to 2.5 wt.-% based on the total weight of the respective CMP composition,
(D) an aqueous medium
wherein the CMP composition (Q) has a pH of more than 6 and less than 9

According to a further aspect of the invention there is provided a chemical mechanical polishing (CMP) composition comprising
(A) colloidal silica particles in a total amount of from 0.01 wt.-% to 2 wt.-% based on the total weight of the respective CMP composition
(B) at least one organic compound (B) selected from the group consisting of glutamic acid, aspartic acid, ethylenediaminetetraacetic acid, iminodiacetic acid, nitrilotriacetic acid, diethylene triamine pentaacetic acid, cysteic acid, aminotris(methylenephosphonic acid), diethylenetriamine penta(methylene phosphonic acid) and ethylenediamine tetra(methylene phosphonic acid) in a total amount of from 0.1 wt.-% to 2 wt.-% based on the total weight of the respective CMP composition
(C) hydrogen peroxide in a total amount of from 0.2 wt.-% to 1.8 wt.-% based on the total weight of the respective CMP composition
(D) an aqueous medium
(E) at least one corrosion inhibitor (E) selected from the group consisting of imidazole, benzimidazole, 4-(dimethylamino) benzoic acid, terephthalic acid, Isophthalic acid, 6,6',6"-(1,3,5-Triazine-2,4,6-triyltriimino)trihexanoic acid, phenyltetrazole, N-Lauroylsarcosine, 4-Dodecylbenzene sulfonic acid and phosphoric acid $C_6$-$C_{10}$ al-kyl ester in a total amount of from 0.002 wt.-% to 0.1 wt.-% based on the total weight of the respective CMP composition
(F) at least one amphiphilic non-ionic surfactant comprising a polyoxyalkylene group (F) in a total amount of from 0.001 to 0.05 wt.-% based on the total weight of the respective CMP composition.
wherein the CMP composition has a pH of more than 6 and less than 9
which fulfills the objects of the invention.

In addition, the above-mentioned objects of the invention are achieved by a process for the manufacture of a semiconductor device comprising the chemical mechanical polishing of a substrate (S) used in the semiconductor industry wherein the substrate (S) comprises (i) cobalt and/or (ii) a cobalt alloy and (iii) TiN and/or TaN in the presence of a CMP composition (Q) as in the presence of said chemical mechanical polishing (CMP) composition (Q).

Surprisingly, it could be found that the use of a CMP composition (Q) according to the invention is leading to high material removal rates of cobalt combined with proper TiN and/or TaN material removal rates on cobalt and/or a cobalt alloy and TiN and/or TaN and low silicon dioxide material removal rates on multi-layer substrates.

DETAILED DESCRIPTION

Figure 1:
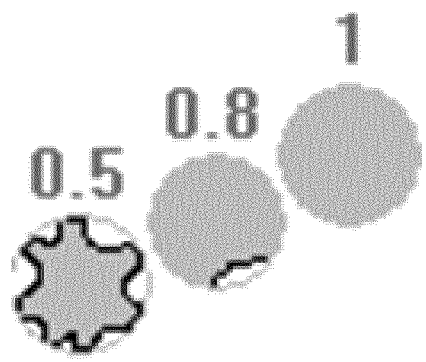
FIG. 1: shows a schematic illustration of the variation of the shape factor with the shape of a particle.

Preferred embodiments are explained in the claims and the specification. It is understood that combinations of preferred embodiments are within the scope of the present invention According to the invention, the CMP composition comprises inorganic particles (A).

Generally, the chemical nature of inorganic particles (A) is not particularly limited. (A) may be of the same chemical nature or a mixture of particles of different chemical nature. As a rule, particles (A) of the same chemical nature are preferred.

(A) can be
  inorganic particles such as a metal, a metal oxide or carbide, including a metalloid, a metalloid oxide or carbide, or
  a mixture of inorganic particles.

Generally, (A) can be
  of one type of colloidal inorganic particles,
  of one type of fumed inorganic particles,
  a mixture of different types of colloidal and/or fumed inorganic particles, Generally, colloidal inorganic particles are inorganic particles which are produced by a wet precipitation process; fumed inorganic particles are produced by high temperature flame hydrolysis of for example metal chloride precursor with hydrogen in the presence of oxygen, for example using the Aerosil® process.

Preferably, inorganic particles (A) are colloidal or fumed inorganic particles or a mixture thereof. Among them, oxides and carbides of metals or metalloids are preferred. More preferably, particles (A) are alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures or composites thereof. Most preferably, particles (A) are alumina, ceria, silica, titania, zirconia, or mixtures or composites thereof. In particular, (A) are silica particles. For example, (A) are colloidal silica particles.

As used herein, the term "colloidal silica" refers to silicon dioxide that has been prepared by condensation polymerization of $Si(OH)_4$. The precursor $Si(OH)_4$ can be obtained, for example, by hydrolysis of high purity alkoxysilanes, or by acidification of aqueous silicate solutions. Such colloidal silica can be prepared in accordance with U.S. Pat. No. 5,230,833 or can be obtained as any of various commercially available products, such as the Fuso PL-1, PL-2, and PL-3 products, and the Nalco 1050, 2327 and 2329 products, as well as other similar products available from DuPont, Bayer, Applied Research, Nissan Chemical, Nyacol and Clariant.

According to the invention the amount of (A) in the CMP composition (Q) is not more than 3.0 wt. % based on the total weight of the composition (Q). Preferably not more than 2.5 wt. %, most preferably not more than 1.8 wt. %, particularly not more than 1.5 wt. %, based on the total weight of the composition (Q). According to the invention, the amount of (A) is at least 0.0001 wt. %, preferably at least 0.02 wt. %, more preferably at least 0.1 wt. %, most preferably at least 0.2 wt. %, particularly at least 0.3 wt. %, based on the total weight of the composition (Q). For example the amount of (A) can be in the range of from 0.4 wt. % to 1.2 wt. %.

Generally, the particles (A) can be contained in the composition (Q) in various particle size distributions. The particle size distribution of the particles (A) can be monomodal or multimodal. In case of multimodal particle size distribution, bimodal is often preferred. In order to have an easily reproducible property profile and easily reproducible conditions during the CMP process of the invention, a monomodal particle size distribution may be preferred for the particles (A). Often it is most preferred for the particles (A) to have a monomodal particle size distribution.

Generally which particle size distribution the particles (A) may have is not particularly limited. The mean particle size of the particles (A) can vary within a wide range. The mean particle size is the $d_{50}$ value of the particle size distribution of the particles (A) in the aqueous medium (E) and can be measured for example using dynamic light scattering (DLS) or static light scattering (SLS) methods. These and other methods are well known in the art, see e.g. Kuntzsch, Timo; Witnik, Ulrike; Hollatz, Michael Stintz; Ripperger, Siegfried; Characterization of Slurries Used for Chemical-Mechanical Polishing (CMP) in the Semiconductor Industry; Chem. Eng. Technol; 26 (2003), volume 12, page 1235.

For DLS, typically a Horiba LB-550 V (DLS, dynamic light scattering measurement according to manual) or any other such instrument is used. This technique measures the hydrodynamic diameter of the particles as they scatter a laser light source (A=650 nm), detected at an angle of 90° or 173° to the incoming light. Variations in the intensity of the scattered light are due to the random Brownian motion of the particles as they move through the incident beam and are monitored as a function of time. Autocorrelation functions performed by the instrument as a function of delay time are used to extract decay constants; smaller particles move with higher velocity through the incident beam and correspond to faster decays.

These decay constants are proportional to the diffusion coefficient, $D_t$, of the particle and are used to calculate particle size according to the Stokes-Einstein equation:

$$D_h = \frac{k_B T}{3\pi \eta D_t}$$

where the suspended particles are assumed to (1) have a spherical morphology and (2) be uniformly dispersed (i.e. not agglomerated) throughout the aqueous medium (E). This relationship is expected to hold true for particle dispersions that contain lower than 1% by weight of solids as there are no significant deviations in the viscosity of the aqueous dispersant (E), in which η=0.96 mPa·s (at T=22° C.). The particle size distribution of the fumed or colloidal inorganic particle dispersion (A) is usually measured in a plastic cuvette at 0.1 to 1.0% solid concentration and dilution, if necessary, is carried out with the dispersion medium or ultra-pure water.

Preferably, the mean particle size of the particles (A) is in the range of from 20 to 200 nm, more preferably in the range of from 25 to 180 nm, most preferably in the range of from 30 to 170 nm, particularly preferably in the range of from 40 to 160 nm, and in particular in the range of from 45 to 150 nm, as measured with dynamic light scattering techniques using instruments for example a High Performance Particle Sizer (HPPS) from Malvern Instruments, Ltd. or Horiba LB550.

The BET surface determined according to DIN ISO 9277:2010-09 of the particles (A) can vary within a wide range. Preferably, the BET surface of the particles (A) is in the range of from 1 to 500 $m^2/g$, more preferably in the range of from 5 to 250 $m^2/g$, most preferably in the range of from 10 to 100 $m^2/g$, in particular in the range of from 20 to 95 $m^2/g$, for example in the range of from 25 to 92 $m^2/g$.

The particles (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of agglomerates, cubes, cubes with bevelled edges, octahedrons, icosahedrons, cocoons, nodules or spheres with or without protrusions or indentations. Preferably, they are essentially spherical, whereby typically these have protrusions or indentations.

It may be preferred that, the inorganic particles (A) are cocoon-shaped. The cocoons may be with or without protrusions or indentations. Cocoon-shaped particles are particles with a minor axis of from 10 to 200 nm, a ratio of major/minor axis of 1.4 to 2.2, more preferably of 1.6 to 2.0. Preferably they have an averaged shape factor of from 0.7 to 0.97, more preferably of from 0.77 to 0.92, preferably an averaged sphericity of from 0.4 to 0.9, more preferably of from 0.5 to 0.7 and preferably an averaged equivalent circle diameter of from 41 to 66 nm, more preferably of from 48 to 60 nm, which can be determined by transmission electron microscopy and scanning electron microscopy.

The determination of the shape factor, the sphericity and the equivalent circle diameter of cocoon-shaped particles is explained hereinbelow with reference to FIGS. 1 to 4.

The shape factor gives information on the shape and the indentations of an individual particle (see FIG. 1) and can be calculated according to the following formula:

shape factor=$4\pi(\text{area}/\text{perimeter}^2)$

The shape factor of a spheric particle without indentations is 1. The value of shape factor decreases when the number of indentations increases.

The sphericity (see FIG. 2) gives information on the elongation of an individual particle using the moment about the mean and can be calculated according to the following formula wherein M are the centres of gravity of the respective particle:

sphericity=$(M_{xx}-M_{yy})-[4M_{xy}^2+(M_{yy}-M_{xx})^2]^{0.5}/(M_{xx}-M_{yy})+[4 M_{xy}^2+(M_{yy}-M_{xx})^2]^{0.5}$ elongation=$(1/\text{sphericity})^{0.5}$ wherein
$Mxx=\Sigma(x-x_{mean})^2/N$
$Myy=\Sigma(y-y_{mean})^2/N$ Mxy=Σ[(x−x$_{mean}$)*(y−y$_{mean}$)]/N
N number of pixels forming the image of the respective particle
x, y coordinates of the pixels
x$_{mean}$ mean value of the x coordinates of the N pixels forming the image of said particle
y$_{mean}$ mean value of the y coordinates of the N pixels forming the image of said particle The sphericity of a spheric particle is 1. The value of the sphericity decreases when particles are elongated.

Figure 3:
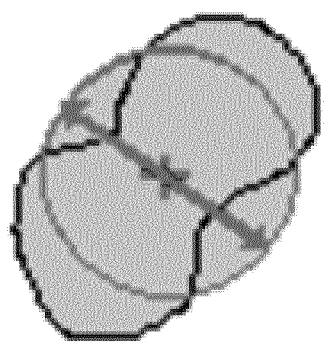
FIG. 3: shows a schematic illustration of the Equivalent Circle Diameter (ECD)
Figure 4:
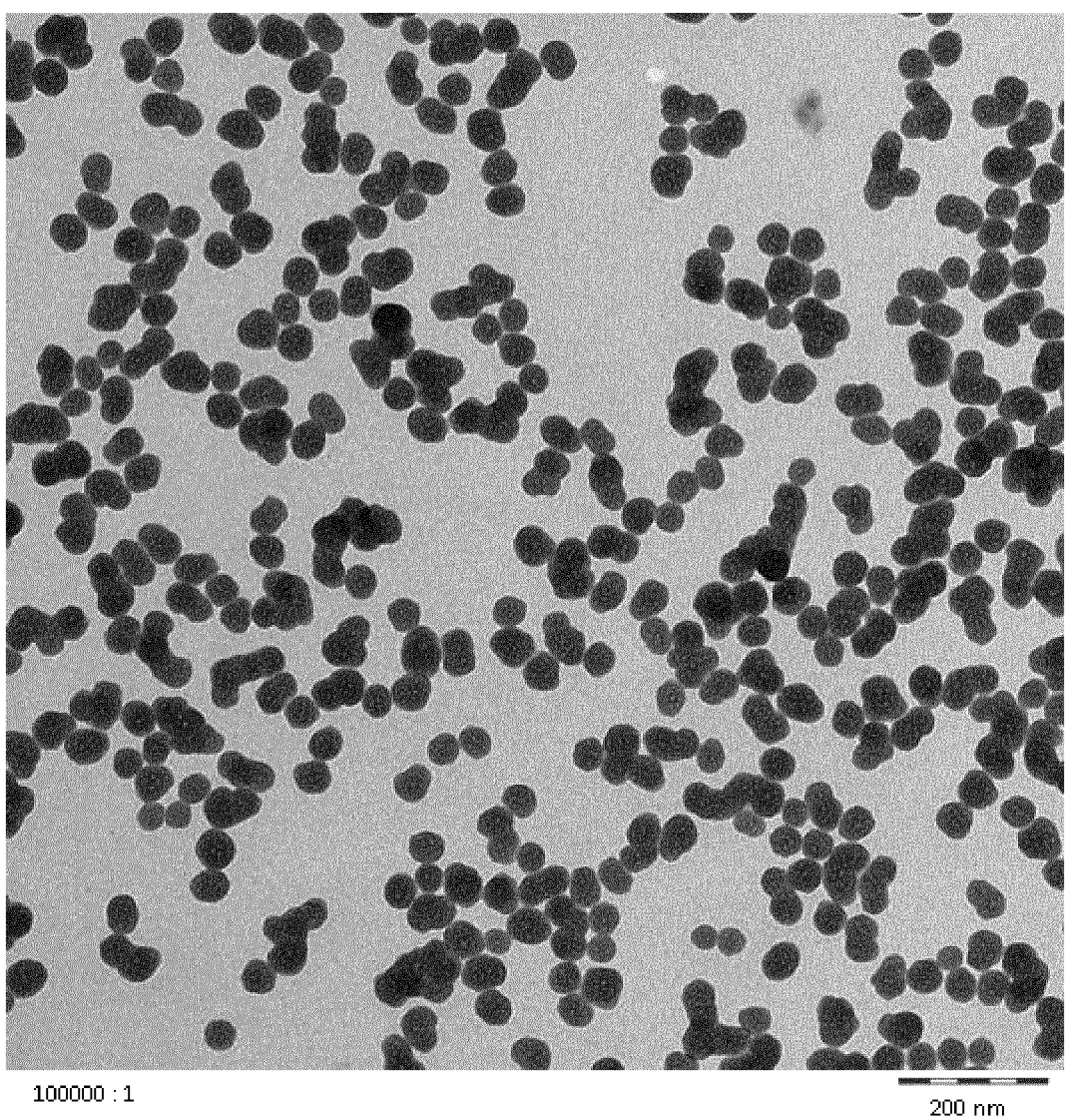
FIG. 4: shows an Energy Filtered-Transmission Electron Microscopy (EF-TEM) (120 kilo volts) image of a dried cocoon-shaped silica particle dispersion with 20 wt. % solid content on a carbon foil.
Figure 5:
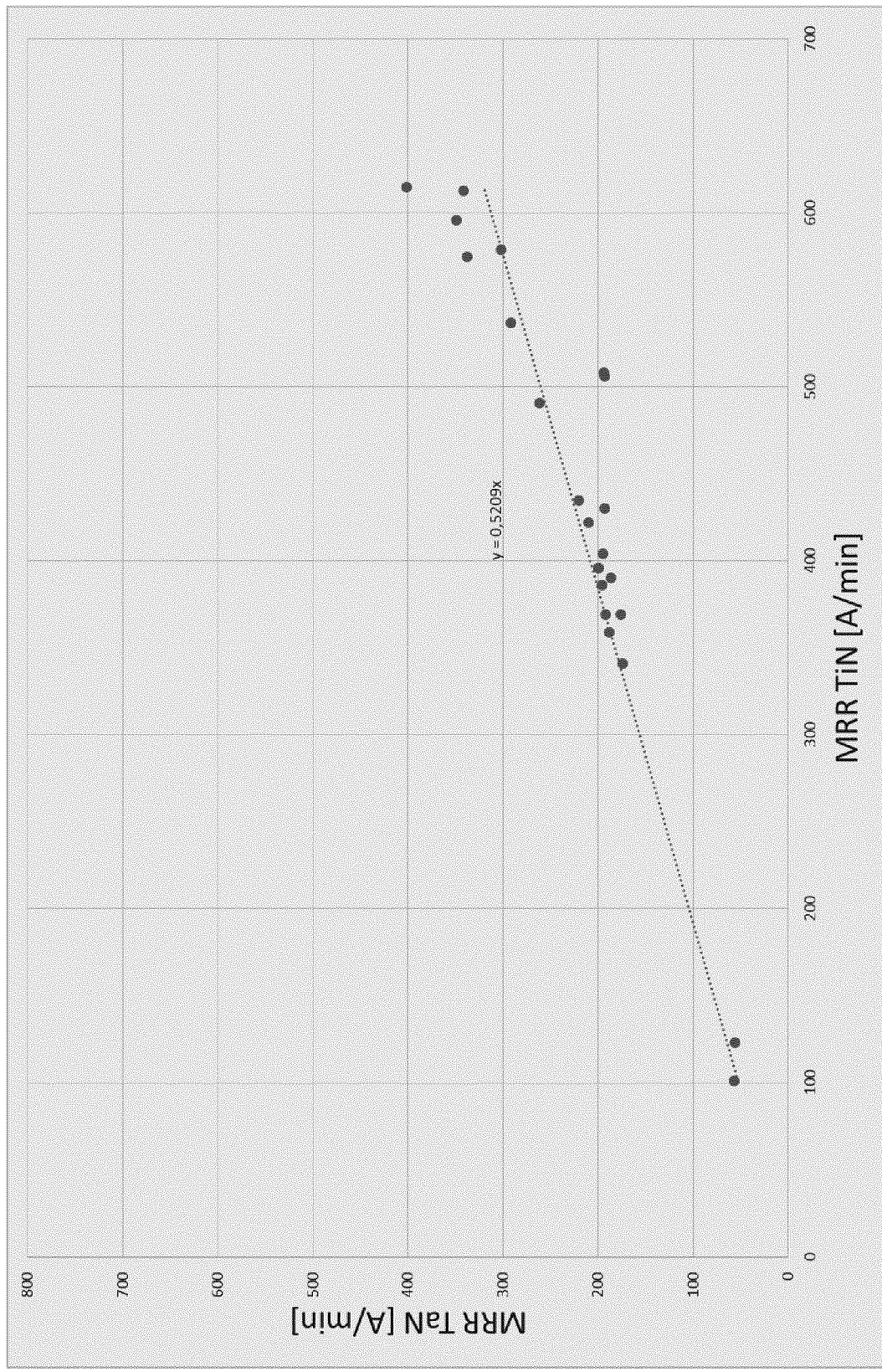
FIG. 5: shows a correlation diagram of TiN with TaN material removal rates.

The equivalent circle diameter (also abbreviated as ECD in the following) of an individual noncircular particle gives information on the diameter of a circle which has the same area as the respective non-circular particle (see FIG. 3).

The averaged shape factor, averaged sphericity and averaged ECD are the arithmetic averages of the respective property related to the analyzed number of particles.

The procedure for particle shape characterization is as follows. An aqueous cocoon-shaped silica particle dispersion with 20 wt. % solid content is dispersed on a carbon foil and is dried. The dried dispersion is analyzed by using Energy Filtered-Transmission Electron Microscopy (EF-TEM) (120 kilo volts) and Scanning Electron Microscopy secondary electron image (SEM-SE) (5 kilo volts). The EF-TEM image (see FIG. 4) having a resolution of 2 k, 16 Bit, 0.6851 nm/pixel is used for the analysis. The images are binary coded using the threshold after noise suppression. Afterwards the particles are manually separated. Overlying and edge particles are discriminated and not used for the analysis. ECD, shape factor and sphericity as defined before are calculated and statistically classified.

For example, cocoon-shaped particles may be FUSO® PL-3 manufactured by Fuso Chemical Corporation having an average primary particle size (d1) of 35 nm and an average secondary particle size (d2) of 70 nm.

According to the invention, the used CMP composition (Q) comprises (B) at least one organic compound comprising an amino-group and an acid group (Y), wherein said compound comprises n amino groups and at least n+1 acidic protons, wherein n is a integer≥1.

In general, any of such organic compounds can be used.

The acid group (Y) is defined as being (Y) as such and its deprotonated form. The acid group (Y) comprised in the organic compound (B) is preferably any acid group so that the pKa value (logarithmic measure of the acid dissociation constant) of

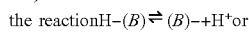
the reaction H−(B) ⇌ (B)−+H$^+$ or

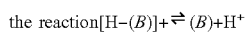
the reaction [H−(B)]+ ⇌ (B)+H$^+$ is not more than 7, more preferably not more than 6, most preferably not more than 5.5, particularly preferably not more than 5, as measured in de-ionized water at 25° C. and atmospheric pressure.

The acid group (Y) comprised in organic compound (B) is preferably a carboxylic acid (—COOH), a carbonic acid (—O—COOH), a sulfonic acid (—SO$_3$H), a sulfuric acid (—O—SO$_3$H), a phosphonic acid (—P(=O)(OH)$_2$), a phosphoric acid (—O—P(=O)(OH)$_2$) moiety, or their deprotonated forms. More preferably, said acid group (Y) is a carboxylic acid (—COOH), a sulfonic acid (—SO$_3$H), a sulfuric acid (—O—SO$_3$H) or a phosphonic acid (—P(=O)(OH)$_2$) moiety, or their deprotonated forms. Most preferably, said acid group (Y) is a carboxylic acid (—COOH) a sulfonic acid (SO$_3$H) or a phosphonic acid (—P(=O)(OH)$_2$) moiety, or its deprotonated form.

Preferably, the acid group (Y) is directly covalently bound to a carbon atom of the organic compound (B).

The organic compound (B) comprising an amino-group and an acid group (Y), wherein said compound comprises n amino groups and at least n+1 acidic protons, wherein n is a integer≥1 is preferably an amino acid, a substituted ethylene diamine, a substituted diethylenetriamine, a secondary amine or tertiary amine. More preferably (B) is an amino acid, a substituted ethylene diamine, a substituted diethylenetriamine, or a tertiary amine. Most preferably (B) is an alpha-amino acid, a substituted ethylene diamine or a substituted diethylenetriamine.

For example the organic compound (B) is an acidic alpha-amino acid.

The organic compound (B) comprises an amino-group and an acid group (Y), wherein said compound comprises n amino groups and at least n+1 acidic protons, wherein n is an integer≥1. Preferably n is 1, 2, 3, 4 or 5. More preferably n is 1, 2, 3 or 4. Most preferably n is 1, 2 or 3. For example n is 1.

The at least one organic compound (B) is a non-polymeric compound preferably with a molecular weight of below 600 g/mol. More preferably with a molecular weight of below 580 g/mol. Most preferably with a molecular weight of below 300 g/mol. For example with a molecular weight of below 250 g/mol.

Generally any organic compound that has an amino group and an acid group are referred to as amino acids. For the purposes of this invention, all individual stereoisomers and racemic mixtures thereof are also contemplated for the amino acids. It may be preferred that both the amino and the acid groups are attached to one carbon (termed as alpha-amino carboxylic acids) are used as the chemical additive in the CMP slurry. Many alpha-amino carboxylic acids are known and there are twenty "natural" amino acids which are used as basic components of proteins in living organisms. The amino acids can be acidic, neutral or basic depending on their side chains in presence of an aqueous carrier. If the side chain of the alpha amino acid contains an additional proton donating group (acidic group) for example a carboxylic group the amino acid is an acidic amino acid.

Substituted in the context of the present invention is to be understood as at least one carbon atom containing group covalently bound to at least one of the nitrogen atoms of the ethylene diamine or diethylenetriamine structure if present in the organic compound (B). The carbon atom containing group acts as linking group between the nitrogen containing ethylene diamine or diethylenetriamine structure and the acid group (Y) resulting as entirety in compound (B).

The carbon atom containing group is preferably a CH$_2$, a CH$_2$CH$_2$, a CH$_2$CH$_2$CH$_2$ or a CH$_2$CH$_2$CH$_2$CH$_2$ group, more preferably a CH$_2$, a CH$_2$CH$_2$ or a CH$_2$CH$_2$CH$_2$ group, most preferably a CH$_2$ group.

If the organic compound (B) comprising an amino-group and an acid group (Y), wherein said compound comprises n amino groups and at least n+1 acidic protons, wherein n is a integer≥1 comprises an amino acid it may preferably be aspartic acid, glutamic acid or cysteic acid and mixtures and salts thereof. For example (B) is aspartic acid.

If the organic compound (B) comprising an amino-group and an acid group (Y), wherein said compound comprises n amino groups and at least n+1 acidic protons, wherein n is a integer≥1 comprises a substituted ethylene diamine it may preferably be ethylenediaminetetraacetic acid or ethylenediamine tetra(methylene phosphonic acid) and mixtures and salts thereof. For example (B) is ethylenediaminetetraacetic acid.

If the organic compound (B) comprising an amino-group and an acid group (Y), wherein said compound comprises n amino groups and at least n+1 acidic protons, wherein n is a integer≥1 comprises a substituted diethylenetriamine it may preferably be diethylene triamine pentaacetic acid or diethylenetriamine penta(methylene phosphonic acid)

If the organic compound (B) comprising an amino-group and an acid group (Y), wherein said compound comprises n amino groups and at least n+1 acidic protons, wherein n is a integer≥1 comprises a tertiary amine it may preferably be aminotris(methylenephosphonic acid).

According to the invention the amount of (B) in the used CMP composition (Q) is not more than 2 wt. % based on the total weight of the composition (Q). Preferably not more than 1.8 wt. %, most preferably not more than 1.6 wt. %, particularly not more than 1.4 wt. %, based on the total weight of the composition (Q). According to the invention, the amount of (B) is at least 0.1 wt. %, preferably at least 0.4 wt. %, more preferably at least 0.5 wt. %, most preferably at least 0.6 wt. %, particularly at least 0.7 wt. %, based on the total weight of the composition (Q). For example the amount of (B) can be in the range of from 0.45 wt. % to 1.59 wt. %.

The addition of organic compound (B) comprising an amino-group and an acid group (Y), wherein said compound comprises n amino groups and at least n+1 acidic protons, wherein n is a integer≥1 as polishing additive may increase the metal material removal rates of all metals namely cobalt and/or a cobalt alloy and TiN and/or TaN, which could surprisingly be found and is different to other amino acids for example glycine which only enhances the Co material removal rate.

The CMP composition used according to the present invention comprises at least one oxidizer (C), preferably one to two types of oxidizers (C), more preferably one type of oxidizer (C). The oxidizer (C) is different from the components (A), (B), (D), (E) and (F). In general, an oxidizer is a compound which is capable of oxidizing the to-be-polished substrate or one of its layers. Preferably, (C) is a per-type oxidizer. More preferably, (C) is a peroxide, persulfate, perchlorate, perbromate, periodate, permanganate, or a derivative thereof. Most preferably, (C) is a peroxide or persulfate. Particularly, (C) is a peroxide. For example, (C) is hydrogen peroxide.

The at least one oxidizer (C) can be contained in varying amounts in the CMP composition used according to the present invention. Preferably, the amount of (C) is not more than 2.5 wt. % (wt. % in each case stands for "percent by weight"), more preferably not more than 2.2 wt. %, most preferably not more than 1.8 wt. %, particularly not more than 1.5 wt. %, for example not more than 1.2 wt. %, in each case based on the total weight of the CMP composition used according to the present invention. Preferably, the amount of (C) is at least 0.2 wt. %, more preferably at least 0.25 wt. %, most preferably at least 0.3 wt. %, particularly at least 0.35 wt. %, for example at least 0.4 wt. %, in each case based on the total weight of the composition used according to the present invention.

According to the invention the used CMP composition comprises an aqueous medium (D). (D) can be of one type or a mixture of different types of aqueous media.

In general, the aqueous medium (D) can be any medium which contains water. Preferably, the aqueous medium (D) is a mixture of water and an organic solvent miscible with water (e.g. an alcohol, preferably a $C_1$ to $C_3$ alcohol, or an alkylene glycol derivative). More preferably, the aqueous medium (D) is water. Most preferably, the aqueous medium (D) is de-ionized water.

If the amounts of the components other than (D) are in total x % by weight of the CMP composition, then the amount of (D) is (100−x) % by weight of the CMP composition (Q).

The properties of the CMP composition used according to the invention respectively, such as stability, polishing performance and etching behavior of the composition as against different materials, for example metals vs. silicon dioxide, may depend on the pH of the corresponding composition.

According to the invention the used CMP composition (Q) has a pH in the range of from more than 6 to less than 9. Preferably, the pH value of the compositions used according to the invention respectively is in the range of from 6.2 to 8.9, more preferably from 6.8 to 8.8, most preferably from 7.5 to 8.7, particularly preferably from 7.8 to 8.6, for example from 7.9 to 8.5.

The used CMP composition (Q) of the invention can further optionally contain at least one corrosion inhibitor (E)

Generally a corrosion inhibitor is a compound which can form a protective molecular layer on the respective substrate surface. During polishing metal ions of the polished surface get into the polishing solution. Therefore, it is an important property of a potential corrosion inhibitor to react preferred with the to be protected surface of the substrate instead of acting as classical complexing chelating agent by reacting with the metal ions in solution in forming metal complexes. The commonly well-known corrosion inhibitor used in for example Cu-CMP benzotriazole (BTA) and other triazoles (1,2,3-triazole. 1,2,4-triazole) cannot sufficiently be used for corrosion inhibition of Co containing substrates or layers. It is presently believed that BTA and the other triazoles preferably react as complexing/chelating agent with dissolved Co-ions and not with the Co surface of the substrate. The Co-BTA/triazole complexes formed are not sufficiently soluble in an aqueous medium and precipitate. Over polishing time, the BTA/triazole concentration in solution is continuously reduced so that beside the anyway reduced reaction tendency of BTA/triazoles with the Co-substrate surface the reaction probability with the surface is additionally reduced by the decreasing concentration resulting in nearly no corrosion protection of the surface. In addition, the precipitated Co-BTA/Co-triazole negatively influences the polishing performance by forming defects on the to be polished surface and effects the polishing equipment for example the polishing pad by discoloration.

Generally any of such compound may be used as corrosion inhibitor (E).

Preferably, the at least one corrosion inhibitor (E) is Phthalic acid, 4-Sulfophthalic acid, 4-Hydroxyphthalic acid, 3-Aminophthalic acid, 4-Aminophthalic acid, 4-Methylphthalic acid, 4-methoxyphthalic acid, 3,3,4,4-Benzophenonetetracarboxylic acid, 5-Aminoisophthalic acid, Isophthalic acid, 1,3,5-Benzenetricarboxylic acid, 5-Hydroxyisophthalic acid, 5-Methylisophthalic acid, 1,2,3-Benzenetricarboxylic acid hydrate, 4-hydroxyisophthalic acid, 5-Methoxyisophthalic acid, 4-Methoxyisophthalic acid, (1,1,2,1)Terphenyl-3,5-dicarboxylic acid, 1,2,4,5-Benzenetetracarboxylic acid, Terephthalic acid, 1,2,4-Benzenetricarboxylic acid, 2-Aminoterephthalic acid, 9,10-Anthracenedicarboxylic acid, Benzenepentacarboxylic acid, Mellitic acid, 2,5-Dihydroxyterephthalic acid, 2,5-Diaminoterephthalic acid, 2,5-Dimethyl-Terephthalic acid dimethylester, 5,5-Carbonylbis-(Trimellitic acid), 3,5-Dimethylpyrazole, Pyrazole, 5-methyl-1H-pyrazole-3-carboxylic acid, 1-Methylpyrazole, 1,3,5-trimethyl-1H-pyrazole-4-carboxylic acid, 3-Methyl-1-phenyl-1H-pyrazole, 3,5-Dimethyl-1-phenylpyrazole, 5-Amino-3-methyl-1-phenylpyrazole, 1-phenyl-1H-pyrazole-5-carboxylic acid, 5-phenyl-1H- pyrazole-3-carboxylic acid, 3,5-Diphenylpyrazole, 5-Amino-1-methyl-1H-pyrazole, 3-Methylpyrazole, 3-Amino-5-phenylpyrazole, 3-Pyrazolecarboxylic acid, 3-Aminopyrazole, 3-Amino-5-ethyl-1H-pyrazole, 1-Methyl-1H-pyrazol-3-amine, 3(5)Phenyl-1H-pyrazole, 4,6-Dihydroxypyrazolo[3,4-d]pyrimidine, 3,5-Pyrazoledicarboxylic acid monohydrate, 1,3-dimethyl-1H-pyrazol-5-amine, 5-Amino-1-ethylpyrazole, ethyl 3-methyl-1H-pyrazole-5-carboxylate, 1,3-diphenyl-1H-pyrazol-5-amine, ethyl 1,5-dimethyl-1H-pyrazole-3-carboxylate, 1,3-Dimethyl-1H-pyrazole-5-carboxylic acid, 1,5-dimethyl-1H-pyrazole-3-carboxylic acid, dimethyl pyrazolo[1,5-a]pyridine-2,3-dicarboxylate, 1-Methyl-1H-pyrazole-4-carboxylic acid, 3-Amino-5-hydroxypyrazole, 3-Amino-4-carbethoxypyrazole, 4-Methylpyrazole, 1-methyl-3-phenyl-1H-pyrazol-5-amine, 1-Methyl-5-phenyl-1H-pyrazole-3-carboxylic acid, 1-methyl-3-phenyl-1H-pyrazole-5-carboxylic acid, methyl 1H-pyrazole-3-carboxylate, 1-methyl-1H-pyrazole-5-carboxylic acid, ethyl 5-amino-1-phenyl-1H-pyrazole-4-carboxylate, pyrazolo[1,5-a]pyridine-3-carboxylic acid, 4-(1H-pyrazol-1-yl)aniline, 5-amino-1-methyl-1H-pyrazole-4-carboxamide, 1-methyl-1H-pyrazole-3-carboxylic acid, Pyrazolo[1,5-a]pyrimidine-3-carboxylic acid, 3-(4-Methoxyphenyl)pyrazole, 1,3,5-trimethyl-1H-pyrazol-4-amine, 3-(5-methyl-1H-pyrazol-4-yl)propylamine, Ethyl 5-amino-1-methylpyrazole-4-carboxylate, 3-methyl-1H-pyrazol-5-amine, 2-methyl-2H-indazole-3-carboxylic acid, ethyl 3,5-dimethyl-1H-4-pyrazolecarboxylate, Ethyl 4-pyrazolecarboxylate, Diethyl pyrazole-3,5-dicarboxylate, 4-Pyrazolecarboxylic acid, 6-Amino-2-methyl-2H-indazole, 1-ethyl-3-methyl-1H-pyrazole-5-carboxylic acid, 4-(3,5-dimethyl-1H-pyrazol-1-yl)aniline, 4-[3,5-di(tert-butyl)-1H-pyrazol-1-yl]aniline, 2-(1H-pyrazol-1-yl)benzoic acid, (1,3-dimethyl-1H-pyrazol-5-yl)methanol, (3,5-dimethyl-1-phenyl-1H-pyrazol-4-yl)methanol, 3,5-dimethyl-1-phenyl-1H-pyrazole-4-carboxylic acid, pyrazolo[1,5-a]pyridine-2-carboxylic acid, 5-Amino-3-(4-methylphenyl)pyrazole, 4-(3,5-dimethyl-1H-pyrazol-1-yl)benzoic acid, 4-ethyl hydrogen 1-methyl-1H-pyrazole-4,5-dicarboxylate, 3-Amino-5-tert-butyl-1H-pyrazole, (1-Methyl-1H-pyrazol-5-yl)methanol, (1-methyl-1H-pyrazol-3-yl)methanol, 7-Amino-2-methylindazole, 5-methyl-1-phenyl-1H-pyrazole-4-carboxylic acid, 3-(2-furyl)-1H-pyrazol-5-amine, 1-benzyl-3-(tert-butyl)-1H-pyrazole-5-carboxylic acid, ethyl 3-(2-furyl)-1-methyl-1H-pyrazole-5-carboxylate, 1-methyl-5-phenyl-1H-pyrazole-4-carboxylic acid, 5-(2-furyl)-1-methyl-1H-pyrazole-3-carboxylic acid, 3,5-dimethyl-1H-pyrazole-4-carboxylic acid, 5-(2-furyl)-1H-pyrazole-3-carboxylic acid, 1-phenyl-1H-pyrazole-4-carboxylic acid, 3-(tert-butyl)-1-methyl-1H-pyrazol-5-amine, 3-cyclopropyl-1-methyl-1H-pyrazol-5-amine, Histamine, Caffeine, Theophylline, Xanthine, L-Histidine, Guanine, Theobromine, Urocanic acid, Guanosine, Imidazo[1,2-a]pyridine, Imidazole, Benzimidazol L-Carnosine, 5-Aminoimidazole-4-carboxamide, 7-(2,3-Dihydroxypropyl)theophylline, 1,1'-Carbonyldiimidazole, 4,5-Imidazoledicarboxylic acid, N-Methylimidazole, 4-phenyl-1H-imidazole, 2-Phenylimidazole, N-[2-(1H-imidazol-4-yl)ethyl]acetamide, 2-Methylimidazole, Imidazo[1,2-b]pyridazine, 4-Methylimidazole, 2'-Deoxyinosine, 2,4-Dimethylimidazole, 2-Ethylimidazole, 1H-Imidazole-4-carboxylic acid, 3-Methylxanthine, 1,2-Dimethylimidazole, 1-Acetylimidazole, 5-Aminoimidazole-4-carboxamide-1-beta-D-ribofuranoside, Dimethyl 4,5-imidazoledicarboxylate, 1-Benzylimidazole, 1-Dodecylimidazole, N-(3-Aminopropyl)imidazole, imidazo[1,2-a]pyridine-3-carboxylic acid, 1-Phenylimidazole, 4-(Imidazol-1-yl)phenol, 1H-imidazole-2-carboxylic acid, 1-Methyl-1H-imidazole-4-carboxylic acid methyl ester, methyl 1-methyl-1H-imidazole-5-carboxylate, (1-methyl-1H-imidazol-4-yl)methanol, Methyl 4-imidazolecarboxylate, (1-methyl-1H-imidazol-2-yl)methanol, 4-(1H-imidazol-1-yl)benzoic acid, Nalpha-BOC-L-Histidine, 1,1'-Oxalyldiimidazole, 3-(1H-imidazol-1-yl)propanoic acid, 2-amino-7-ethyl-1,7-dihydro-6H-purin-6-one, 1-methyl-1H-imidazole-2-carboxylic acid, 2-methylimidazo[1,2-a]pyridine-3-carboxylic acid, 2-(1H-Imidazol-1-yl)benzylamine, 2-(1H-imidazol-1-yl)aniline, 2-(2-methyl-1H-imidazol-1-yl)aniline, 3-Isobutyl-1-methylxanthine, 1-Allylimidazole, 2-Isopropylimidazole, 1-methyl-1H-imidazole-4-carboxylic acid, 1-methyl-1H-imidazole-5-carboxylic acid, Ethyl 4-methyl-5-imidazolecarboxylate, 4-(1H-imidazol-1-ylmethyl)aniline, Acycloguanosine, Imidazo[1,2-a]pyridine-2-carboxylic acid monohydrate, (2-butyl-1H-imidazol-4-yl)methanol, (2-butyl-1H-imidazol-4-yl)methanol, 4-(2-methyl-1H-imidazol-1-yl)aniline, 2-phenyl-1H-imidazole-4-carboxylic acid 1.5 hydrate, imidazo[1,2-a]pyridin-2-ylmethanol, [4-(1H-imidazol-1-yl)phenyl]methanol, [4-(1H-imidazol-1-ylmethyl)phenyl]methanol, imidazo[1,2-a]pyridine-6-carbonitrile, 3-(1H-imidazol-1-yl)benzoic acid, N-alphaFMOC-N-Trityl-L-histidine, 4-(1H-imidazol-1-ylmethyl)benzonitrile, 3-(1H-imidazol-1-ylmethyl)aniline, 1,2-Dimethyl-1H-imidazole-5-carboxylic acid, Tetrazole, 5-Phenyltetrazole, 5-aminotetrazol, 5-(aminomethyl) tetrazol, 1-propyl 5-amino tetrazol, 1-butyl 5-amino tetrazol, 3-(1H-Tetrazol-1-yl)propanoic acid, (5-Amino-1H-tetraazol-1-yl)acetic acid, 4-(1H-tetrazol-1-ylmethyl)benzoic acid, Ethyl (5-amino-1H-tetrazol-1-yl)acetate, Ethyl 1H-tetrazole-5-acetate, 5-(4-Methylphenyl)-1H-tetrazole, 4-(1H-tetrazol-5-ylmethyl)phenol, 4-[(5-Methyl-1H-tetrazol-1-yl)methyl]benzoic acid, 4-(1H-Tetrazol-5-yloxy)aniline, 3-(1H-Tetrazol-5-yl)benzyl alcohol, 4-(1H-Tetrazol-5-yl)piperidine, 2-(1H-Tetrazol-1-yl)aniline, 1-Allyl-N-benzyl-1H-tetrazol-5-amine, 2-(1H-Tetrazol-5-yl)-phenylamine, 3-(1H-Tetraazol-1-yl)phenol, Pentylenetetrazole, (5-Methyl-1H-tetraazol-1-yl)(phenyl)acetic acid, 2-Amino-4-(1H-tetraazol-5-yl)benzoic acid, 3-Methoxy-5-(1H-tetrazol-1-yl)aniline, 3-phenyl-2-tetrazol-1-yl-propionic acid, 4-(5-methyl-1H-tetrazol-1-yl)aniline, 3-(5-Methyl-1H-tetraazol-1-yl)aniline, 3-(1H-Tetraazol-1-yl)benzoic acid, 4-(5-Methyl-1H-tetrazol-1-yl)phenol, 2-Hydroxy-5-(1H-tetrazol-1-yl)benzoic acid, 3-(5-Methyl-1H-tetraazol-1-yl)phenol, 3-(5-p-Tolyl-tetrazol-1-yl)-propionic acid, 5-(3-Pyridyl)-1H-tetrazole, 5-(2-Pyridyl)-1H-tetrazole, [4-(5-Methyl-1H-tetraazol-1-yl)phenyl]acetic acid, 3-(1H-Tetraazol-1-yl)-1H-pyrazole-4-carboxylic acid, (5-Amino-1H-tetraazol-1-yl)acetic acid, (5-Methyl-1H-tetraazol-1-yl)(phenyl)acetic acid, [4-(5-Methyl-1H-tetraazol-1-yl)phenyl]acetic acid, 1-Allyl-N-benzyl-1H-tetrazol-5-amine, 1H-Tetraazole-5-acetic acid, 2-(1H-Tetrazol-1-yl)aniline, 2-(1H-Tetrazol-5-yl)-phenylamine, 2-Amino-4-(1H-tetraazol-5-yl)benzoic acid, 2-Hydroxy-5-(1H-tetrazol-1-yl)benzoic acid, 3-(1H-Tetraazol-1-yl)-1H-pyrazole-4-carboxylic acid, 3-(1H-Tetraazol-1-yl)benzoic acid, 3-(1H-Tetraazol-1-yl)phenol, 3-(1H-Tetrazol-5-yl)benzyl alcohol, 3-(5-Methyl-1H-tetraazol-1-yl)phenol, 3-(5-p-Tolyl-tetrazol-1-yl)-propionic acid, 3-phenyl-2-tetrazol-1-yl-propionic acid, 4-(1H-tetrazol-1-ylmethyl)benzoic acid, 4-(1H-Tetrazol-5-yl)piperidine, 4-(1H-Tetrazol-5-ylmethyl)phenol, 4-(5-methyl-1H-tetrazol-1-yl)aniline, 4-(5-Methyl-1H-tetrazol-1-yl)phenol, 4-[(5-Methyl-1H-tetrazol-1-yl)methyl]benzoic acid, Ethyl (5-amino-1H-tetrazol-1-yl)acetate, Ethyl 1H-tetrazole-5-acetate, 2-phenyl-3-[4-(1H-1,2,3,4-tetraazol-5-yl)benzyl]-4H-chromen-4-one, 2-phenyl-3-[4-(1H-1,2,3,4-tetraazol-5-yl)benzylidene]chroman-4-one, 4-ethyl-5-(1-phenyl-1H-1,2,3,4-tetraazol-5-yl)pyrimidin-2-amine, 6-phenyl-5,6-dihydrobenzo[f][1,2,3,4]tetraazolo[1,5-d][1,4]oxazepine, 4-ethyl-5-[1-(4-methylphenyl)-1H-1,2,3,4-tetraazol-5-yl]pyrimidin-2-amine, 5-[1-(4-methylphenyl)-1H-1,2,3,4-tetraazol-5-yl]-4-propylpyrimidin-2-amine, 4-methyl-3-[1-(4- methylphenyl)-1H-1,2,3,4-tetraazol-5-yl]quinolone, 4-methyl-3-(1-phenyl-1H-1,2,3,4-tetraazol-5-yl)quinolone, N1-benzyl-2-(1-phenyl-1H-1,2,3,4-tetraazol-5-yl)eth-1-en-1-amine, N1,N1-diethyl-2-[1-(4-methylphenyl)-1H-1,2,3,4-tetraazol-5-yl]eth-1-en-1-amine, methyl 2-{[2-(1-phenyl-1H-1,2,3,4-tetraazol-5-yl)vinyl]amino}benzoate, 2,4-diphenyl-5-(1-phenyl-1H-1,2,3,4-tetraazol-5-yl)pyrimidine, 5-[1-(4-methylphenyl)-1H-1,2,3,4-tetraazol-5-yl]-2,4-diphenylpyrimidine, 1-[4-(tert-butyl)phenyl]-5-phenyl-1H-1,2,3,4-tetraazole, N2-methyl-4-phenyl-5-(1-phenyl-1H-1,2,3,4-tetraazol-5-yl)pyrimidin-2-amine, 3,5-di(acetyloxy)-2-[(acetyloxy)methyl]-6-(1H-1,2,3,4-tetraazol-5-yl) tetrahydro-2H-pyran-4-yl acetate, 3-{5-[4-(tert-butyl) phenyl]-1H-1,2,3,4-tetraazol-1-yl}pyridine, 7-methyl-5-phenyl[1,2,3,4]tetraazolo[1,5-a]pyrimidine, 5-methyl-N-(1H-1,2,3,4-tetraazol-5-yl)-2-pyrazinecarboxamide, 5-methyl-3-[1-(4-methylphenyl)-1H-1,2,3,4-tetraazol-5-yl]-1H-indole, 3-[1-(4-methoxyphenyl)-1H-1,2,3,4-tetraazol-5-yl]-5-methyl-1H-indole, 2,3-di(acetyloxy)-1-[1,2-di(acetyloxy)ethyl]-3-(1H-1,2,3,4-tetraazol-5-yl)propyl acetate, 2,3-di(acetyloxy)-1-[1,2-di(acetyloxy)ethyl]-3-(1H-1,2,3,4-tetraazol-5-yl)propyl acetate, 3-[1-(4-methylphenyl)-1H-1,2,3,4-tetraazol-5-yl]-1,4-dihydroquinolin-4-one, 3-(1-phenyl-1H-1,2,3,4-tetraazol-5-yl)-1,4-dihydroquinolin-4-one, 3-(dimethylamino)-1-(4-methylphenyl)-2-(1-phenyl-1H-1,2,3,4-tetraazol-5-yl)prop-2-en-1-one, 3-(dimethylamino)-1-(2-methylphenyl)-2-(1-phenyl-1H-1,2,3,4-tetraazol-5-yl)prop-2-en-1-one, ethyl 2-({2-[1-(4-methylphenyl)-1H-1,2,3,4-tetraazol-5-yl]vinyl}amino)benzoate, N-methyl-N-(2-{methyl[2-(1-phenyl-1H-1,2,3,4-tetraazol-5-yl)vinyl]amino}ethyl)-N-[2-(1-phenyl-1H-1,2,3,4-tetraazol-5-yl)vinyl]amine, 4-methyl-sulfonyl benzoic acid, 3-methylamino benzoic acid, 4-(diethylamino)benzoic acid, 3-dimethylamino benzoic acid, 2 (benzylamino)benzoic acid, 4-methylamino benzoic acid, 4-(dimethylamino) benzoic acid, N-Oleoylsarcosine, N-Lauroylsarcosine, N-Cocoylsarcosine, N-Cocoylglutamate, 4-Dodecylbenzene sulfonic acid, Toluolsulfonsäure, Tetrapropylenbenzolsulfonat, phosphoric acid hexyl ester, Phosphoric acid alkyl ester (C6-C10), ([Iminobis(methylen)]bisphosphonsäure, N-Kokos-Alkylderivate), ([Iminobis(methylen)]bisphosphonsäure, N-Kokos-Alkylderivate)-N-Oxid, 6,6',6"-(1,3,5-Triazine-2,4,6-triyltriimino)trihexanoic acid, 2,4,6-trimethylmelamine, Pentamethylmelamine, {bis(dimethylamino)-1,3,5-triazin-2-yl)](methyl)amino}methanol, ({bis[(hydroxymethyl)amino)]-1,3,5-triazin-2-yl}amino) methanol, 2,4-diamino-6-diallylamino-1,3,5-triazine, ({bis[bis(hydroxyl-methyl)amino]-1,3,5-triazin-2-yl}(hydroxyl-methyl)amino)methanol, N2,N4-di-tert-butyl-1,3,5-triazine-2,4,6-triamine, N2,N4-bis(prop-2-en-1-yl)-1,3,5-triazine-2,4,6-triamine and mixtures and salts thereof.

More preferably the at least one corrosion inhibitor (E) is Phthalic acid, 4-Hydroxyphthalic acid, 3-Aminophthalic acid, 4-Aminophthalic acid, 4-Methylphthalic acid, 5-Aminoisophthalic acid, Isophthalic acid, 1,3,5-Benzenetricarboxylic acid, 5-Hydroxyisophthalic acid, 5-Methylisophthalic acid, 1,2,3-Benzenetricarboxylic acid hydrate, 4-hydroxyisophthalic acid, 5-Methoxyisophthalic acid, 4-Methoxyisophthalic acid, 1,2,4,5-Benzenetetracarboxylic acid, Terephthalic acid, 1,2,4-Benzenetricarboxylic acid, 2-Aminoterephthalic acid, 2,5-Dihydroxyterephthalic acid, 2,5-Diaminoterephthalic acid, 3,5-Dimethylpyrazole, Pyrazole, 1-Methylpyrazole, 3-Methyl-1-phenyl-1H-pyrazole, 3,5-Dimethyl-1-phenylpyrazole, 5-Amino-3-methyl-1-phenylpyrazole, 3,5-Diphenylpyrazole, 5-Amino-1-methyl-1H-pyrazole, 3-Methylpyrazole, 3-Amino-5-phenylpyrazole, 3-Aminopyrazole, 3-Amino-5-ethyl-1H-pyrazole, 1-Methyl-1H-pyrazol-3-amine, 3(5)-Phenyl-1H-pyrazole, 5-Amino-1-ethylpyrazole, 3-Amino-5-hydroxypyrazole, 4-Methylpyrazole, 3-(4-Methoxyphenyl)pyrazole, 6-Amino-2-methyl-2H-indazole, 5-Amino-3-(4-methylphenyl)pyrazole, 3-Amino-5-tert-butyl-1H-pyrazole, 7-Amino-2-methylindazole, Imidazole, Benzimidazole, 2-Methylimidazole, 4-Methylimidazole, 2,4-Dimethylimidazole, 2-Ethylimidazole, 1,2-Dimethylimidazole, 1-Allylimidazole, 1-Acetylimidazole, 2-Isopropylimidazole, Imidazo[1,2-a]pyridine, Imidazo[1,2-b]pyridazine, N-(3-Aminopropyl)imidazole, 2-Phenylimidazole, 1-Phenylimidazole, 1-Benzylimidazole 4-(Imidazol-1-yl)phenol, 1,1'-Carbonyldiimidazole, 2-(1H-Imidazol-1-yl)benzylamine, Tetrazole, 5-Phenyltetrazole, 5-aminotetrazol, 5-(aminomethyl) tetrazol, 1-propyl 5-amino tetrazol, 1-butyl 5-amino tetrazol, 5-(4-Methylphenyl)-1H-tetrazole, 4-(1H-Tetrazol-5-yl)piperidine, Pentylenetetrazole, 5-(3-Pyridyl)-1H-tetrazole, 3-methylamino benzoic acid, 4-(diethylamino)benzoic acid, 3-dimethylamino benzoic acid, 2 (benzylamino)benzoic acid, 4-methylamino benzoic acid, N-Oleoylsarcosine, N-Lauroylsarcosine, N-Cocoylsarcosine, N-Cocoylglutamate, 4-Dodecylbenzene sulfonic acid, Toluolsulfonsäure, Tetrapropylenbenzolsulfonat, phosphoric acid hexyl ester, Phosphoric acid alkyl ester (C6-C10), ([Iminobis(methylen)]bisphosphonsäure, N-Kokos-Alkylderivate), ([Iminobis(methylen)]bisphosphonsäure, N-Kokos-Alkylderivate)-N-Oxid, 6,6',6"-(1,3,5-Triazine-2,4,6-triyltriimino)trihexanoic acid and mixtures and salts thereof Most preferably the at least one corrosion inhibitor (E) is imidazole, benzimidazole, 4-(dimethylamino) benzoic acid, terephthalic acid, Isophthalic acid, 3,5-Dimethylpyrazole, Pyrazole, 1-Methylpyrazole, 6,6',6"-(1,3,5-Triazine-2,4,6-triyltriimino)trihexanoic acid, 5-phenyltetrazole, N-Lauroylsarcosine, 4-Dodecylbenzene sulfonic acid and phosphoric acid C6-C10 alkyl ester and mixtures and salts thereof.

The at least one corrosion inhibitor (E) has preferably a pka value of below 8, more preferably of below 7.8, most preferably of below 7.6. For example a pka value of below 7.57.

According to the invention the amount of (E) in the used CMP composition (Q) is not more than 0.1 wt. % based on the total weight of the composition (Q). Preferably not more than 0.08 wt. %, most preferably not more than 0.07 wt. %, particularly not more than 0.05 wt. %, based on the total weight of the composition (Q). According to the invention, the amount of (E) in the used CMP composition (Q) is at least 0.001 wt. %, preferably at least 0.005 wt. %, more preferably at least 0.008 wt. %, most preferably at least 0.01 wt. %, particularly at least 0.015 wt. %, based on the total weight of the composition (Q). For example the amount of (E) can be in the range of from 0.012 wt. % to 0.06 wt. %.

The CMP composition (Q) used according to the invention can further optionally contain at least one non-ionic surfactant (F).

Generally, a surfactant used in a CMP composition is a surface-active compound which decreases the surface tension of a liquid, the interfacial tension between two liquids, or that between a liquid and a solid.

In general, any non-ionic surfactant (F) can be used.

The non-ionic surfactant (F) is preferably water-soluble and/or water-dispersible, more preferably water-soluble. "Water-soluble" means that the relevant component or ingredient of the composition of the invention can be dissolved in the aqueous phase on the molecular level. "Water-dispersible" means that the relevant component or ingredient of the composition of the invention can be dispersed in the aqueous phase and forms a stable emulsion or suspension.

The non-ionic surfactant (F) is preferably an amphiphilic non-ionic surfactant, i.e. a surfactant which comprises at least one hydrophobic group (b1) and at least one hydrophilic group (b2). This means that the nonionic surfactant (F) can comprise more than one hydrophobic group (b1), e.g., 2, 3 or more groups (b1), which are separated from each other by at least one hydrophilic group (b2) as hereinbelow described. This also means that the nonionic surfactant (F) can comprise more than one hydrophilic group (b2), e.g., 2, 3 or more groups (b2) which are separated from each other by hydrophobic groups (b1) as hereinbelow described.

Therefore, the nonionic surfactant (F) can have different blocklike general structures. Examples of such general blocklike structures are:
  b1-b2,
  b1-b2-b1,
  b2-b1-b2,
  b2-b1-b2-b1,
  b1-b2-b1-b2-b1, and
  b2-b1-b2-b1-b2.

The non-ionic surfactant (F) is more preferably an amphiphilic non-ionic surfactant comprising a polyoxyalkylene group.

The hydrophobic group (b1) is preferably an alkyl group, more preferably an alkyl group having 4 to 40, most preferably 5 to 20, particularly preferably 7 to 18, in particular 10 to 16, for example 11 to 14 carbon atoms.

The hydrophilic group (b2) is preferably a polyoxyalkylene group. Said polyoxyalkylene groups can be oligomeric or polymeric. More preferably, the hydrophilic group (b2) is a hydrophilic group selected from the group consisting of polyoxyalkylene groups comprising
(b21) oxyalkylene monomer units, and
(b22) oxyalkylene monomer units other than oxyethylene monomer units,
said monomer units (b21) being not identical to monomer units (b22), and said polyoxyalkylene group of (b2) containing the monomer units (b21) and (b22) in random, alternating, gradient and/or block-like distribution.

Most preferably, the hydrophilic group (b2) is a hydrophilic group selected from the group consisting of polyoxyalkylene groups comprising
(b21) oxyethylene monomer units, and
(b22) oxyalkylene monomer units other than oxyethylene monomer units,
said polyoxyalkylene group of (b2) containing the monomer units (b21) and (b22) in random, alternating, gradient and/or block-like distribution.

Preferably, the oxyalkylene monomer units other than oxyethylene monomer units (b22) are substituted oxyalkylene monomer units wherein the substituents are selected from the group consisting of alkyl, cycloalkyl, aryl, alkyl-cycloalkyl, alkyl-aryl, cycloalkyl-aryl and alkyl-cycloalkyl-aryl groups. The oxyalkylene monomer units other than oxyethylene monomer units (b22) are
  more preferably derived from substituted oxiranes (X) wherein the substituents are selected from the group consisting of alkyl, cycloalkyl, aryl, alkyl-cycloalkyl, alkyl-aryl, cycloalkyl-aryl and alkyl-cycloalkyl-aryl groups,
  most preferably derived from alkyl-substituted oxiranes (X),
  particularly preferably derived from substituted oxiranes (X) wherein the substituents are selected from the group consisting of alkyl groups having 1 to 10 carbon atoms,
for example derived from methyl oxirane (propyleneoxide) and/or ethyl oxirane (butylene oxide).

The substituents of the substituted oxiranes (X) themselves can also carry inert substituents, i.e., substituents which do not adversely affect the copolymerization of the oxiranes (X) and the surface activity of the non-ionic surfactants (F). Examples of such inert substituents are fluorine and chlorine atoms, nitro groups and nitrile groups. If such inert substituents are present, they are used in such amounts that they do not adversely affect the hydrophilic-hydrophobic balance of the non-ionic surfactant (F). Preferably, the substituents of the substituted oxiranes (X) do not carry such inert substituents.

The substituents of the substituted oxiranes (X) are preferably selected from the group consisting of alkyl groups having 1 to 10 carbon atoms, cycloalkyl groups having 5 to 10 carbon atoms in spirocyclic, exocyclic and/or annealed configuration, aryl groups having 6 to 10 carbon atoms, alkyl-cycloalkyl groups having 6 to 20 carbon atoms, alkyl-aryl groups having 7 to 20 carbon atoms, cycloalkyl-aryl-group 11 to 20 carbon atoms, and alkyl-cycloalkyl-aryl groups having 12 to 30 carbon atoms. Most preferably, the substituents of the substituted oxiranes (X) are selected from the group consisting of alkyl groups having 1 to 10 carbon atoms. Particularly, the substituents of the substituted oxiranes (X) are selected from the group consisting of alkyl groups having 1 to 6 carbon atoms.

Examples for the most preferred substituted oxiranes (X) are methyl oxirane (propyleneoxide) and/or ethyl oxirane (butylene oxide), particularly methyl oxirane.

Most preferably, the hydrophilic group (b2) consists of the monomer units (b21) and (b22).

In another embodiment, the hydrophilic group (b2) is preferably a polyoxyethylene, polyoxypropylene or polyoxybutylene group, more preferably a polyoxyethylene group.

In case that the hydrophilic group (b2) comprises or consists of the monomer units (b21) and (b22), the polyoxyalkylene group—acting as hydrophilic group (b2)—contains the monomer units (b21) and (b22) in random, alternating, gradient and/or blocklike distribution. This means, that one hydrophilic group (b2) can have only one type of distribution, i.e.,
  random: . . . -b21-b21-b22-b21-b22-b22-b22-b21-b22- . . . ;
  alternating: . . . -b21-b22-b21-b22-b21- . . . ;
  gradient: . . . b21-b21-b21-b22-b21-b22-b22-b21-b22-b22-b22- . . . ; or
  blocklike: . . . -b21-b21-b21-b21-b22-b22-b22-b22- . . . .

Alternatively, the hydrophilic group (b2) can also contain at least two types of distributions, e.g., an oligomeric or polymeric segment having a random distribution and an oligomeric or polymeric segment having alternating distribution. Most preferably, the hydrophilic group (b2) preferably has only one type of distribution, and most preferably, said distribution is random or blocklike.

In the embodiments where the hydrophilic group (b2) comprises or consists of the monomer units (b21) and (b22), the molar ratio of (b21) to (b22) can vary broadly and, therefore, can be adjusted most advantageously to the particular requirements of the composition, the process and the use of the invention. Preferably the molar ratio (b21):(b22) is from 100:1 to 1:1, more preferably, from 60:1 to 1.5:1 and, most preferably, from 50:1 to 1.5:1, and particularly preferably, from 25:1 to 1.5:1, and particularly, from 15:1 to 2:1, and for example, from 9:1 to 2:1.

Also the degree of polymerization of the oligomeric and polymeric polyoxyalkylene groups—acting as hydrophilic groups (b2)—can vary broadly and, therefore, can be adjusted most advantageously to the particular requirements of the composition, the process and the use of the invention. Preferably, the degree of polymerization is in the range of from 5 to 100, preferably 5 to 90, and most preferably, 5 to 80.

Particularly, the non-ionic surfactant (F) is an amphiphilic non-ionic polyoxyethylene-polyoxypropylene alkyl ether surfactant which is a mixture of molecules containing, on the average, an alkyl group having 10 to 16 carbon atoms and 5 to 20 oxyethylene monomer units (b21) and 2 to 8 oxypropylene monomer units in random distribution. For example, the non-ionic surfactant (F) is an amphiphilic non-ionic polyoxyethylene-polyoxypropylene alkyl ether surfactant which is a mixture of molecules containing, on the average, an alkyl group having 11 to 14 carbon atoms and 12 to 20 oxyethylene monomer units and 3 to 5 oxypropylene monomer units in random distribution.

The non-ionic surfactant (F) if present can be contained in varying amounts in the CMP composition (Q) used according to the invention. Preferably, the amount of (F) is not more than 10 wt. %, more preferably not more than 3 wt. %, most preferably not more than 1 wt. %, particularly preferably not more than 0.5 wt. %, particularly not more than 0.1 wt. %, for example not more than 0.05 wt. %, based on the total weight of the composition (Q). Preferably, the amount of (F) is at least 0.00001 wt. %, more preferably at least 0.0001 wt. %, most preferably at least 0.0008 wt. %, particularly preferably at least 0.002 wt. %, particularly at least 0.005 wt. %, for example at least 0.008 wt. %, based on the total weight of the composition (Q).

Generally, the non-ionic surfactant (F) can have different weight average molecular weights.

The weight average molecular weight of (F) is preferably at least 300, more preferably at least 500, most preferably at least 700, particularly at least 800, for example at least 900. The weight average molecular weight of (F) is preferably not more than 15,000, more preferably not more than 6,000, most preferably not more than 3,000, particularly not more than 2,000, for example not more than 1,400 [g/mol], as determined by gel permeation chromatography (abbreviated as "GPC" in the following). In particular, the weight average molecular weight of (F) is from 900 to 1,400 [g/mol] as determined by GPC. Said GPC are standard GPC techniques known to the person skilled of the art.

In general, the solubility of non-ionic surfactant (F) in an aqueous medium can vary within a wide range. The solubility of (F) in water at pH 7 at 25° C. under atmospheric pressure is preferably at least 1 g/L, more preferably at least 5 g/L, most preferably at least 20 g/L, particularly at least 50 g/L, for example at least 150 g/L. Said solubility can be determined by evaporating the solvent and measuring the remaining mass in the saturated solution.

The used CMP composition of the invention can further optionally contain at least one biocide (H), for example one biocide. In general, the biocide is a compound which deters, renders harmless, or exerts a controlling effect on any harmful organism by chemical or biological means. Preferably, (H) is an quaternary ammonium compound, an isothiazolinone-based compound, an N-substituted diazenium dioxide, or an N'-hydroxy-diazenium oxide salt. More preferably, (H) is an N-substituted diazenium dioxide, or an N'-hydroxy-diazenium oxide salt.

If present, the biocide (H) can be contained in varying amounts in the used CMP composition (Q) according to the invention. If present, the amount of (H) is preferably not more than 0.5 wt. %, more preferably not more than 0.1 wt. %, most preferably not more than 0.05 wt. %, particularly not more than 0.02 wt. %, for example not more than 0.008 wt. %, based on the total weight of the corresponding composition. If present, the amount of (H) is preferably at least 0.0001 wt. %, more preferably at least 0.0005 wt. %, most preferably at least 0.001 wt. %, particularly at least 0.003 wt. %, for example at least 0.006 wt. %, based on the total weight of the corresponding composition.

The CMP compositions used according to the invention respectively may also contain, if necessary depending on the specific requirements of the intended use of said CMP composition, various other additives, including but not limited to pH adjusting agents, buffer substances, stabilizers, friction reducing agents etc. Said other additives are for instance those commonly employed in CMP compositions and thus known to the person skilled in the art. Such addition can for example stabilize the dispersion, or improve the polishing performance, or the selectivity between different layers.

If present, said additive can be contained in varying amounts. Preferably, the amount of said additive is not more than 10 wt. %, more preferably not more than 1 wt. %, most preferably not more than 0.1 wt. %, for example not more than 0.01 wt. %, based on the total weight of the corresponding composition. Preferably, the amount of said additive is at least 0.0001 wt. %, more preferably at least 0.001 wt. %, most preferably at least 0.01 wt. %, for example at least 0.1 wt. %, based on the total weight of the corresponding composition.

The CMP composition (Q) used according to the invention is for chemical-mechanical polishing of a substrate (S) used in the semiconductor industry wherein the substrate (S) comprises cobalt and/or a cobalt alloy and TiN and/or TaN.

The cobalt and/or cobalt alloy can be of any type, form, or shape. The cobalt and/or cobalt alloy preferably has the shape of a layer and/or overgrowth. If this cobalt and/or cobalt alloy has the shape of a layer and/or overgrowth, the cobalt and/or cobalt alloy content is preferably more than 90%, more preferably more than 95%, most preferably more than 98%, particularly more than 99%, for example more than 99.9% by weight of the corresponding layer and/or overgrowth. The cobalt and/or cobalt alloy has been preferably filled or grown in trenches or plugs between other substrates, more preferably filled or grown in trenches or plugs in dielectric materials like for example $SiO_2$, silicon, low-k (BD1, BD2) or ultra low-k materials, or other isolating and semiconducting material used in the semiconductor industry. For example in the Through Silicon Vias (TSV) middle process insolated materials such as polymers, photoresist and/or polyimide can be used as insulating material between the subsequent processing steps of wet etch and CMP for insulating/isolating properties after revealing the TSV from the backside of the wafer. Between the copper comprising and the dielectric material can be a thin layer of a barrier material. Generally barrier materials to prevent metal ions from diffusing into the dielectric material are Ti/TiN, Ta/TaN or for example Ru or Ru-alloys, Co or Co-alloys. Another application of Cobalt in semiconductor chip manufacturing is the deposition of cobalt by CVD or PVD methods into trenches or vias. The dielectric layer is covered by a liner to make sure that the Co will not delaminate or diffuse into the dielectric layer. As liner and/or barrier a layer of TiN and/or TaN are used.

The CMP composition (Q) according to the invention is used for polishing a substrate comprising cobalt and/or cobalt alloy and TiN and/or TaN. The static etch rate (SER) of cobalt is preferably below 100 Å/min, more preferably below 80 Å/min, most preferably below 70 Å/min, in particular preferably below 60 Å/min, for example the static etch rate may be below 48 Å/min.

The CMP composition (Q) according to the invention is used for polishing a substrate comprising cobalt and/or cobalt alloy and TiN and/or TaN. The material removal rate (MRR) of cobalt is preferably in the range of from 1000 to 4000 Å/min, more preferably in the range of from 1200 to 3900 Å/min, most preferably in the range of from 1400 to 3850 Å/min, in particular preferably in the range of from 1500 to 3820 Å/min, for example the cobalt material removal rate is in the range of from 1600 to 3870 Å/min; and the material removal rate of TiN is preferably in the range of from 250 to 700 Å/min, more preferably in the range of from 280 to 680 Å/min, most preferably in the range of from 301 to 670 Å/min, in particular preferably in the range of from 305 to 660 Å/min, for example the TiN material removal rate is in the range of from 300 to 678 Å/min.

The TaN and TiN material removal rates are correlated.

A semiconductor device can be manufactured by a process which comprises the chemical mechanical polishing of a substrate (S) used in the semiconductor industry in the presence of the CMP composition (Q) of the invention. According to the invention said process comprises the chemical mechanical polishing of a substrate (S) comprising cobalt and/or cobalt alloy and TiN and/or TaN.

Generally, the semiconductor device which can be manufactured by the process according to the invention is not particularly limited. Thus the semiconductor devices can be an electronic component comprising semiconducting materials, as for example silicon, germanium, and III-V materials. Semiconductor devices can be those which are manufactured as single discrete devices or those which are manufactured as integrated circuits (ICs) consisting of a number of devices manufactured and interconnected on a wafer. Semiconductor devices can be two terminal devices for example a diode, three terminal devices for example a bipolar transistor, four terminal devices for example a Hall effect sensor or multi-terminal devices. Preferably, said semiconductor device is a multi-terminal device. Multi-terminal devices can be logic devices as integrated circuits and microprocessors or memory devices as random access memory (RAM), read only memory (ROM) and phase change random access memory (PCRAM). Preferably said semiconductor device is a multi-terminal logic device. In particular said semiconductor device is an integrated circuit or microprocessor.

Generally, in integrated circuits Co is used as adhesion or barrier layer for copper interconnects. In its nano-crystalline form Co is contained for example in memory devices and as metal gate in MOSFET. Cobalt can also be used as a seed to enable plating of copper by electro-deposition. Cobalt or a cobalt alloy can also be used as wiring instead of copper for one or more layers. For example a capacitor (CAP) can be formed by successive layers of metal, insulator, metal (MIM) and a thin film resistor at the same level. Circuit designers can now wire to the TaN thin film resistor at the lowest metal level, which reduces parasitics and allows more efficient usage of the existing wiring levels. The excess copper and/or cobalt and the adhesion/barrier layer comprising Co in form of, for example metal nitrides or metal carbon nitrides, such as Co/TaN, Co/TiN, Co/TaCN, Co/TiCN, or for example as a single cobalt alloy layer, such as CoMo, CoTa, CoTi and CoW above the dielectrics, can be removed by the chemical mechanical polishing process according to the invention.

Generally, this cobalt and/or cobalt alloy and TiN and/or TaN can be produced or obtained in different ways. Cobalt or cobalt alloys can be produced by ALD, PVD or CVD processes. The cobalt or the cobalt alloy is deposited onto a barrier material of TiN and/or TaN. Proper materials for barrier application are well known in the arts. The barrier prevents metal atoms or ions like cobalt or copper from diffusing into the dielectric layer and improves the adhesion properties of the conductive layer. Ta/TaN, Ti/TiN can be used.

Generally, this cobalt and/or cobalt alloy can be of any type, form, or shape. This cobalt and/or cobalt alloy preferably has the shape of a layer and/or overgrowth. If this cobalt and/or cobalt alloy has the shape of a layer and/or overgrowth, the cobalt and/or cobalt alloy content is preferably more than 90%, more preferably more than 95%, most preferably more than 98%, particularly more than 99%, for example more than 99.9% by weight of the corresponding layer and/or overgrowth. This cobalt and/or cobalt alloy has been preferably filled or grown in trenches or plugs between other substrates, more preferably filled or grown in trenches or plugs in dielectric materials like for example $SiO_2$, silicon, low-k (BD1, BD2) or ultra low-k materials, or other isolating and semiconducting material used in the semiconductor industry.

Generally, the down pressure or down force is a downward pressure or a downward force which is applied by the carrier to the wafer pressing it against the pad during CMP. This down pressure or down force can for example be measured in pound per square inch (abbreviated as psi) For example the process of the invention may be performed with a down pressure of 2 psi or lower. Preferably the down pressure is in the range of from 0.1 to 1.9 psi, more preferably in the range of from 0.3 to 1.8 psi, most preferably in the range of from 0.4 to 1.7 psi, particularly preferable in the range of from 0.8 to 1.6 psi, for example 1.5 psi.

The process of the invention comprises the chemical mechanical polishing of a substrate comprising cobalt and/or a cobalt alloy and TiN and/or TaN. The static etch rate (SER) of cobalt is preferably below 100 Å/min, more preferably below 80 Å/min, most preferably below 70 Å/min, in particular preferably below 60 Å/min, for example the static etch rate may be below 48 Å/min.

The process of the invention comprises the chemical mechanical polishing of a substrate comprising cobalt and/or cobalt alloy and TiN and/or TaN. The material removal rate (MRR) of cobalt is preferably in the range of from 1000 to 4000 Å/min, more preferably in the range of from 1200 to 3900 Å/min, most preferably in the range of from 1400 to 3850 Å/min, in particular preferably in the range of from 1500 to 3820 Å/min, for example the cobalt material removal rate is in the range of from 1600 to 3870 Å/min; and the material removal rate of TiN is preferably in the range of from 250 to 700 Å/min, more preferably in the range of from 280 to 680 Å/min, most preferably in the range of from 301 to 670 Å/min, in particular preferably in the range of from 305 to 660 Å/min, for example the TiN material removal rate is in the range of from 300 to 678 Å/min.

These different ranges of cobalt material removal rates and TiN material removal rates can be reached for example by varying the concentration of component (B), component (C) and the concentration of the abrasive (A) of the CMP composition (Q).

Examples of CMP Compositions (Q) Used According to the Invention

Z1:
- (A) colloidal silica particles in a total amount of from 0.01 wt.-% to 2 wt.-% based on the total weight of the respective CMP composition
- (B) glutamic acid in a total amount of from 0.1 wt.-% to 2 wt.-% based on the total weight of the respective CMP composition
- (C) hydrogen peroxide in a total amount of from 0.2 wt.-% to 1.8 wt.-% based on the total weight of the respective CMP composition
- (D) an aqueous medium
- (E) at least one corrosion inhibitor (E) selected from the group consisting of imidazole, benzimidazole, 4-(dimethylamino) benzoic acid, terephthalic acid, Isophthalic acid, 6,6',6"-(1,3,5-Triazine-2,4,6-triyltriimino)trihexanoic acid, phenyltetrazole, N-Lauroylsarcosine, 4-Dodecylbenzene sulfonic acid and phosphoric acid C6-C10 alkyl ester in a total amount of from 0.002 wt.-% to 0.1 wt.-% based on the total weight of the respective CMP composition
- (F) at least one amphiphilic non-ionic surfactant comprising a polyoxyalkylene group (F) in a total amount of from 0.001 to 0.05 wt.-% based on the total weight of the respective CMP composition.
- wherein the CMP composition has a pH of more than 6 and less than 9.

Z2:
- (A) colloidal silica particles in a total amount of from 0.01 wt.-% to 2 wt.-% based on the total weight of the respective CMP composition
- (B) aspartic acid in a total amount of from 0.1 wt.-% to 2 wt.-% based on the total weight of the respective CMP composition
- (C) hydrogen peroxide in a total amount of from 0.2 wt.-% to 1.8 wt.-% based on the total weight of the respective CMP composition
- (D) an aqueous medium
- (E) at least one corrosion inhibitor (E) selected from the group consisting of imidazole, benzimidazole, 4-(dimethylamino) benzoic acid, terephthalic acid, Isophthalic acid, 6,6',6"-(1,3,5-Triazine-2,4,6-triyltriimino)trihexanoic acid, phenyltetrazole, N-Lauroylsarcosine, 4-Dodecylbenzene sulfonic acid and phosphoric acid C6-C10 alkyl ester in a total amount of from 0.002 wt.-% to 0.1 wt.-% based on the total weight of the respective CMP composition
- (F) at least one amphiphilic non-ionic surfactant comprising a polyoxyalkylene group (F) in a total amount of from 0.001 to 0.05 wt.-% based on the total weight of the respective CMP composition.
- wherein the CMP composition has a pH of more than 6 and less than 9.

Z3:
- (A) colloidal silica particles in a total amount of from 0.01 wt.-% to 2 wt.-% based on the total weight of the respective CMP composition
- (B) ethylenediaminetetraacetic acid in a total amount of from 0.1 wt.-% to 2 wt.-% based on the total weight of the respective CMP composition
- (C) hydrogen peroxide in a total amount of from 0.2 wt.-% to 1.8 wt.-% based on the total weight of the respective CMP composition
- (D) an aqueous medium
- (E) at least one corrosion inhibitor (E) selected from the group consisting of imidazole, benzimidazole, 4-(dimethylamino) benzoic acid, terephthalic acid, Isophthalic acid, 6,6',6"-(1,3,5-Triazine-2,4,6-triyltriimino)trihexanoic acid, phenyltetrazole, N-Lauroylsarcosine, 4-Dodecylbenzene sulfonic acid and phosphoric acid C6-C10 alkyl ester in a total amount of from 0.002 wt.-% to 0.1 wt.-% based on the total weight of the respective CMP composition
- (F) at least one amphiphilic non-ionic surfactant comprising a polyoxyalkylene group (F) in a total amount of from 0.001 to 0.05 wt.-% based on the total weight of the respective CMP composition.
- wherein the CMP composition has a pH of more than 6 and less than 9.

Z4:
- (A) colloidal silica particles in a total amount of from 0.01 wt.-% to 2 wt.-% based on the total weight of the respective CMP composition
- (B) diethylene triamine pentaacetic acid in a total amount of from 0.1 wt.-% to 2 wt.-% based on the total weight of the respective CMP composition
- (C) hydrogen peroxide in a total amount of from 0.2 wt.-% to 1.8 wt.-% based on the total weight of the respective CMP composition
- (D) an aqueous medium
- (E) at least one corrosion inhibitor (E) selected from the group consisting of imidazole, benzimidazole, 4-(dimethylamino) benzoic acid, terephthalic acid, Isophthalic acid, 6,6',6"-(1,3,5-Triazine-2,4,6-triyltriimino)trihexanoic acid, phenyltetrazole, N-Lauroylsarcosine, 4-Dodecylbenzene sulfonic acid and phosphoric acid C6-C10 alkyl ester in a total amount of from 0.002 wt.-% to 0.1 wt.-% based on the total weight of the respective CMP composition
- (F) at least one amphiphilic non-ionic surfactant comprising a polyoxyalkylene group (F) in a total amount of from 0.001 to 0.05 wt.-% based on the total weight of the respective CMP composition.
- wherein the CMP composition has a pH of more than 6 and less than 9.

Z5:
- (A) colloidal silica particles in a total amount of from 0.01 wt.-% to 2 wt.-% based on the total weight of the respective CMP composition
- (B) cysteic acid in a total amount of from 0.1 wt.-% to 2 wt.-% based on the total weight of the respective CMP composition
- (C) hydrogen peroxide in a total amount of from 0.2 wt.-% to 1.8 wt.-% based on the total weight of the respective CMP composition
- (D) an aqueous medium
- (E) at least one corrosion inhibitor (E) selected from the group consisting of imidazole, benzimidazole, 4-(dimethylamino) benzoic acid, terephthalic acid, Isophthalic acid, 6,6',6"-(1,3,5-Triazine-2,4,6-triyltriimino)trihexanoic acid, phenyltetrazole, N-Lauroylsarcosine, 4-Dodecylbenzene sulfonic acid and phosphoric acid C6-C10 alkyl ester in a total amount of from 0.002 wt.-% to 0.1 wt.-% based on the total weight of the respective CMP composition
- (F) at least one amphiphilic non-ionic surfactant comprising a polyoxyalkylene group (F) in a total amount of from 0.001 to 0.05 wt.-% based on the total weight of the respective CMP composition.
- wherein the CMP composition has a pH of more than 6 and less than 9.

Z6:
  (A) colloidal silica particles in a total amount of from 0.01 wt.-% to 2 wt.-% based on the total weight of the respective CMP composition
  (B) aminotris(methylenephosphonic acid) in a total amount of from 0.1 wt.-% to 2 wt.-% based on the total weight of the respective CMP composition
  (C) hydrogen peroxide in a total amount of from 0.2 wt.-% to 1.8 wt.-% based on the total weight of the respective CMP composition
  (D) an aqueous medium
  (E) at least one corrosion inhibitor (E) selected from the group consisting of imidazole, benzimidazole, 4-(dimethylamino) benzoic acid, terephthalic acid, Isophthalic acid, 6,6',6"-(1,3,5-Triazine-2,4,6-triyltriimino)trihexanoic acid, phenyltetrazole, N-Lauroylsarcosine, 4-Dodecylbenzene sulfonic acid and phosphoric acid C6-C10 alkyl ester in a total amount of from 0.002 wt.-% to 0.1 wt.-% based on the total weight of the respective CMP composition
  (F) at least one amphiphilic non-ionic surfactant comprising a polyoxyalkylene group (F) in a total amount of from 0.001 to 0.05 wt.-% based on the total weight of the respective CMP composition.
  wherein the CMP composition has a pH of more than 6 and less than 9.

Z7:
  (A) colloidal silica particles in a total amount of from 0.01 wt.-% to 2 wt.-% based on the total weight of the respective CMP composition
  (B) diethylenetriamine penta(methylene phosphonic acid) in a total amount of from 0.1 wt.-% to 2 wt.-% based on the total weight of the respective CMP composition
  (C) hydrogen peroxide in a total amount of from 0.2 wt.-% to 1.8 wt.-% based on the total weight of the respective CMP composition
  (D) an aqueous medium
  (E) at least one corrosion inhibitor (E) selected from the group consisting of imidazole, benzimidazole, 4-(dimethylamino) benzoic acid, terephthalic acid, Isophthalic acid, 6,6',6"-(1,3,5-Triazine-2,4,6-triyltriimino)trihexanoic acid, phenyltetrazole, N-Lauroylsarcosine, 4-Dodecylbenzene sulfonic acid and phosphoric acid C6-C10 alkyl ester in a total amount of from 0.002 wt.-% to 0.1 wt.-% based on the total weight of the respective CMP composition
  (F) at least one amphiphilic non-ionic surfactant comprising a polyoxyalkylene group (F) in a total amount of from 0.001 to 0.05 wt.-% based on the total weight of the respective CMP composition.
  wherein the CMP composition has a pH of more than 6 and less than 9.

Z8:
  (A) colloidal silica particles in a total amount of from 0.01 wt.-% to 2 wt.-% based on the total weight of the respective CMP composition
  (B) ethylenediamine tetra(methylene phosphonic acid) in a total amount of from 0.1 wt.-% to 2 wt.-% based on the total weight of the respective CMP composition
  (C) hydrogen peroxide in a total amount of from 0.2 wt.-% to 1.8 wt.-% based on the total weight of the respective CMP composition
  (D) an aqueous medium
  (E) at least one corrosion inhibitor (E) selected from the group consisting of imidazole, benzimidazole, 4-(dimethylamino) benzoic acid, terephthalic acid, Isophthalic acid, 6,6',6"-(1,3,5-Triazine-2,4,6-triyltriimino)trihexanoic acid, phenyltetrazole, N-Lauroylsarcosine, 4-Dodecylbenzene sulfonic acid and phosphoric acid C6-C10 alkyl ester in a total amount of from 0.002 wt.-% to 0.1 wt.-% based on the total weight of the respective CMP composition
  (F) at least one amphiphilic non-ionic surfactant comprising a polyoxyalkylene group (F) in a total amount of from 0.001 to 0.05 wt.-% based on the total weight of the respective CMP composition.
  wherein the CMP composition has a pH of more than 6 and less than 9.

Processes for preparing CMP compositions are generally known. These processes may be applied to the preparation of the CMP composition used according to the invention. This can be carried out by dispersing or dissolving the above-described components (A), (B), (C) and optional components in the aqueous medium (D), preferably water, and optionally by adjusting the pH value through adding an acid, a base, a buffer or a pH adjusting agent. For this purpose the customary and standard mixing processes and mixing apparatuses such as agitated vessels, high shear impellers, ultrasonic mixers, homogenizer nozzles or counterflow mixers, can be used. The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention the CMP composition of the invention is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

Figure 2:
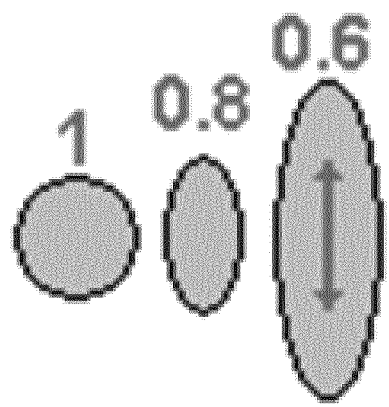
FIG. 2: shows a schematic illustration of the variation of the sphericity with the elongation of a particle.

For further details reference is made to WO 2004/063301 A1, in particular page 16, paragraph [0036] to page 18, paragraph [0040] in conjunction with the FIG. 2.

By way of the CMP process of the invention and/or using the CMP composition of the invention, wafers with integrated circuits comprising cobalt and/or cobalt alloy and TiN and/or TaN can be obtained which have an excellent functionality.

The CMP composition used according to the invention can be used in the CMP process as ready-to-use slurry, they have a long shelf-life and show a stable particle size distribution over long time.

Thus, they are easy to handle and to store. They show an excellent polishing performance, particularly a low static etch rate of cobalt and/or cobalt alloy combined with a high material removal rate (MRR) of cobalt and/or cobalt alloy and TiN and/or TaN. Since the amounts of its components are held down to a minimum, the CMP composition used according to the invention respectively can be used in a cost-effective way.

EXAMPLES AND COMPARATIVE EXAMPLES

The general procedure for the CMP experiments is described below.

Standard CMP process for 200 mm Co wafers:
Tool: Mirra-Mesa (Applied Materials)
down pressure: 1.5 psi;
inner tube pressure 2.5 psi;
retaining ring pressure: 4.0 psi;
polishing table/carrier speed: 93/87 rpm;
slurry flow rate: 200 ml/min;
polishing time: 20 s Co
60 s TEOS, TiN
polishing pad: DOW IC 1010;
conditioning tool: 3M A166 diamond abrasive disk for AMAT CMP machines, in-situ conditioning with 5 lbf down force.

The slurry is stirred in a local supply station.

Standard Analysis Procedure for Film Thickness Measurement:
Cobalt and TiN and TaN film: Resistage RG-120/RT-80, 4 point probe instrument (NAPSON Corporation)
TEOS: Opti-Probe 2600 (Therma Wave, KLA-Tencor).

Film thickness is measured pre and post CMP with a 49 point scan (5 mm edge exclusion). The thickness loss is averaged and divided by the polishing time to give the material removal rate (MRR).

Co coated wafers: 2000 A PVD Co on Ti liner (Supplier: AMT); TiN and TaN: PVD on TEOS The pH-value is measured with a pH combination electrode (Schott, blue line 22 pH electrode).

Standard procedure for determination of Co static etch rates (Co-SER):

Co-SER experiments were carried out as following: 2.5× 2.5 cm PVD Co (from AMT) were cut and washed with ultra pure water (UPW). For each coupon the Co film thickness was measured using a 4-point probe instrument at 5 points and averaged out (pre etching, dbefore). 300 ml of freshly prepared slurry with 0.5% $H_2O_2$ as oxidiser were put into a temperature controlled beaker and stirred. When the slurry has reached 50° C. two Co coupons were put into the slurry and kept in the slurry for 3 min. After the etching has been done the coupons were washed with UPW and dried with $N_2$. The Co film thickness for each coupon was remeasured using the 4 point probe again at 5 points and averaged out (post etching, dafter). The Co-SER was determined by the following formula:

SER (A/min)=($d$before−$d$after)/3

For both coupons the SER was averaged to give the final SER value.

Standard Procedure for Slurry Preparation:

All mixing procedures are carried out under stirring. An aqueous stock solution of each compound (B), (E) and (F) is prepared by dissolving the desired amount of the respective compound in (D) ultra-pure water (UPW). For the stock solutions of (B) and (E) KOH may be used to support dissolution. The pH of the stock solution is adjusted to 8 by KOH. The stock solutions of (B) have a concentration of the respective additive of 10 wt.-%, that of (E) and (F) of 1.0 wt.-%. For (A) a dispersion is used as provided by the supplier, typically about 20%-30% abrasive concentration by weight. The oxidizer (C) is used as 30 wt.-% stock solution.

To prepare 1000 g of slurry 600 g of (D) is given into a mixing tank or beaker. The amounts of stock solutions of (B), (E) and (F) are added to reach the desired concentrations. KOH is used to keep the solution at alkaline to neutral pH. Then (A) is added with the necessary amount. To adjust final concentration (D) is added as balance water, with respect to the necessary amount of oxidizer stock solution. The pH is adjusted to the desired value by KOH. The oxidizer is added with the desired amount about 60 min before CMP.

Inorganic Particles (A) Used in the Examples

Colloidal cocoon-shaped Silica particles (A1) having an average primary particle size (d1) of 35 nm and an average secondary particle size (d2) of 70 nm (as determined using dynamic light scattering techniques via a Horiba instrument) (for example Fuso® PL-3) and a specific surface area of around 46 $m^2/g$ were used.

TABLE 1

Experimental results of particle shape analysis of cocoon-shaped silica particles (A)

| statistical function | ECD | shericity | shape factor |
|---|---|---|---|
| unit | nm | | |
| number of particles | 475 | 475 | 475 |
| average | 53.67 | 0.631 | 0.881 |
| minimum | 33.68 | 0.150 | 0.513 |
| maximum | 99.78 | 0.997 | 0.978 |
| standard deviation | 11.69 | 0.199 | 0.083 |
| median d50 | 51.32 | 0.662 | 0.911 |
| d90 | | | 0.955 |

Procedure for Particle Shape Characterization

An aqueous cocoon-shaped silica particle dispersion with 20 wt. % solid content was dispersed on a carbon foil and was dried. The dried dispersion was analyzed by using Energy Filtered-Transmission Electron Microscopy (EF-TEM) (120 kilo volts) and Scanning Electron Microscopy secondary electron image (SEM-SE) (5 kilo volts). The EF-TEM image with a resolution of 2 k, 16 Bit, 0.6851 nm/pixel (FIG. 4) was used for the analysis. The images were binary coded using the threshold after noise suppression. Afterwards the particles were manually separated. Overlying and edge particles were discriminated and not used for the analysis. ECD, shape factor and sphericity as defined before were calculated and statistically classified.

If present as surfactant (F) an amphiphilic non-ionic polyoxyethylene-polyoxypropylene alkyl ether surfactant is used, which is a mixture of molecules containing, on the average, an alkyl group having 6 to 12 carbon atoms and 2 to 10 oxyethylene monomer units and 1 to 5 oxypropylene monomer units in random distribution (for example Triton™ DF 16 from DOW, Plurafac LF 401 BASF).

TABLE 2

CMP compositions of the examples 1 to 7 and of the comparative examples (abbreviated as Comp. Ex) 1 to 4, concentration and name of compound (B), Co-MRR, TiN-MRR, TaN-MRR, TEOS-MRR data in the process of chemical-mechanical polishing of 200 mm Co wafers using these compositions, wherein the aqueous medium (D) of the CMP compositions is de-ionized water. For all compositions in this table the pH is 8.5 and the amounts of the other components than (B) of the composition are (A) 1.5 wt.-% colloidal silica, (C) 0.5 wt.-% $H_2O_2$ (E) 0.03 wt.-% Phenyltetratzole and (F) 0.01 wt.-% non-ionic surfactant, specified in weight percent (wt. %) by weight of the corresponding CMP composition. If the amounts of the components other than (B) are in total y % by weight of the CMP composition, then the amount of (D) is (100 − y) % by weight of the CMP composition.

| Example | Compound (B) | Concentration of (B) in [wt.-%] | Co MRR [A/min] | TiN MRR [A/min] | TaN MRR [A/min] | TEOS MRR [A/min] |
|---|---|---|---|---|---|---|
| Comp. Ex 1 | Malonic acid | 0.88 | 219 | 637 | 401 | 19 |
| Comp. Ex 2 | Citric acid | 1.08 | 350 | 670 | 507 | 16 |
| Comp. Ex 3 | Glycine | 0.75 | 5058 | 123 | 56 | 7 |
| Ex. 1 | Glutamic acid | 1.24 | 2835 | 491 | 262 | 14 |
| Ex. 2 | DTPA | 1.11 | 2015 | 613 | 342 | 7 |
| Ex. 3 | DTPA (*) | 1.11 | 1970 | 596 | 349 | 7 |
| Ex. 4 | Cysteic acid | 1.58 | 3760 | 615 | 402 | 20 |
| Ex. 5 | Aspartic acid | 1.13 | 2900 | 537 | 292 | 15 |
| Ex. 6 | EDTA | 0.81 | 1848 | 396 | 200 | 13 |
| Comp. Ex. 4 | — |  | 103 | 101 | 57 | 1 |
| Ex. 7 Without Compound (E) | Glutamic acid | 1.24 | 3143 | 568 | 307 | 7 |

DTPA: abbreviation for diethylene triamine pentaacetic acid
EDTA: abbreviation for ethylene diamine tetra acetate
(*): Ex. 3 with 0.06 wt.-% of Phenyltetrazole instead of 0.03 wt.-% Phenyltetrazole After chemical mechanical polishing the wafers according to the invention showed a shiny surface.

TABLE 3

Concentration variation series of the oxidizer (C), composition: pH is 8.5, (A) 1.5 wt.-% colloidal silica, (B) 1.24% glutamic acid, (D) de-ionized water, (E) 0.03 wt.-% Isophthalic acid, (F) 0.01 wt.-% non-ionic surfactant, specified in weight percent (wt. %) by weight of the corresponding CMP composition. If the amounts of the components other than (D) are in total y % by weight of the CMP composition, then the amount of (D) is (100 − y) % by weight of the CMP composition. Co-MRR, TiN-MRR, TEOS-MRR data in the process of chemical-mechanical polishing of 200 mm Co wafers using these compositions.

| Example | Concentration of (C) in [wt.-%] | Co MRR [A/min] | TiN MRR [A/min] | TEOS MRR [A/min] |
|---|---|---|---|---|
| Ex. 8 | 0.00 | 373 | 113 | 24 |
| Ex. 9 | 0.10 | 1619 | 310 | 25 |
| Ex. 10 | 0.20 | 2048 | 403 | 25 |
| Ex. 11 | 0.40 | 2737 | 492 | 21 |
| Ex. 12 | 0.60 | 2816 | 579 | 22 |
| Ex. 13 | 0.80 | 2646 | 629 | 23 |
| Ex. 14 | 1.00 | 2417 | 688 | 22 |
| Ex. 15 | 1.50 | 1894 | 759 | 27 |
| Ex. 16 | 2.00 | 307 | 814 | 23 |
| Ex. 17 | 4.00 | 158 | 989 | 19 |
| Ex. 18 | 0.25 | 1962 | 336 | 21 |
| Ex. 19 | 0.50 | 3100 | 446 | 21 |
| Ex. 20 | 1.00 | 2352 | 599 | 23 |

A large influence of the oxidizer (C) concentration can be seen.

TABLE 4

Variation of component (E) corrosion inhibitor, composition: pH is 8.5, (A) 1.5 wt.-% colloidal silica, (B) 0.81 wt.-% ethylene diamine tetra acetate (EDTA) (C) 0.5 wt.-% $H_2O_2$ (D) de-ionized water (E) specified in table, (F) 0.01 wt.-% non-ionic surfactant Plurafac LF 401, specified in weight percent (wt. %) by weight of the corresponding CMP composition. If the amounts of the components other than (D) are in total y % by weight of the CMP composition, then the amount of (D) is (100 − y) % by weight of the CMP composition. Co-MRR, TiN-MRR, TaN-MRR, TEOS-MRR in the process of chemical-mechanical polishing of 200 mm Co wafers using these compositions and Co-SER data.

| Example | Component (E) corrosion inhibitor | Concentration of (E) [wt.-%] | Co MRR [Å/min] | TiN MRR [Å/min] | TaN MRR [Å/min] | TEOS MRR [Å/min] | Co SER [Å/min] |
|---|---|---|---|---|---|---|---|
| Ex 21 | — | — | 1886 | 506 | 193 | 11 | 72 |
| Ex 22 | Imidazol | 0.03 | 1990 | 422 | 210 | 9 | 18.4 |
| Ex 23 | Benzimidazol | 0.03 | 1979 | 435 | 220 | 11 | 21 |
| Ex 24 | Korantin SMK | 0.005 | 1857 | 404 | 195 | 10 | 3.7 |
| Ex 25 | DBS | 0.005 | 1898 | 390 | 187 | 9 | 7.7 |
| Ex 26 | Perlastan I | 0.005 | 1968 | 386 | 196 | 13 | 9.4 |
| Ex 27 | 4-(Dimethyl amino) benzoic acid | 0.03 | 3818 | 341 | 174 | 4 | 13.6 |
| Ex 28 | Terephthalic acid | 0.03 | 3624 | 359 | 188 | 8 | 48.4 |
| Ex 29 | Isophthalic acid | 0.03 | 3736 | 369 | 192 | 9 | 48.3 |
| Ex 30 | Irgacor L 190 Plus | 0.03 | 3774 | 369 | 176 | 6 | 44.5 |
| Ex 31 | Phenyltetrazol | 0.03 | 1848 | 396 | 200 | 13 | 25.7 |

Comparative Example 5 (Comp. Ex. 5)

Composition pH 8.5, (A) 1.5 wt.-% colloidal silica, (B) 1.24 wt.-% glutamic acid (C) 0.5 wt.-% $H_2O_2$ (D) de-ionized water (E) 0.03 wt.-% Methyl-BTA, (F) 0.01 wt.-% non-ionic surfactant, specified in weight percent (wt. %) by weight of the corresponding CMP composition. If the amounts of the components other than (D) are in total y % by weight of the CMP composition, then the amount of (D) is (100-y) % by weight of the CMP composition. This composition was used to polish Co-wafers. After polishing of 20 PVD Co wafers the polishing pad showed an orange-brown ring on the surface. The material that forms the pad residues deposit not only on the pad, but also on the wafer surface causing increased defect rates and yield loss in production.

The CMP compositions according to the invention are showing an improved polishing performance in terms of high cobalt material removal rates (MRR) [Å/min] combined with increased material removal rates of TiN and TaN and a drastic decrease in the Co etching rates as can be demonstrated by the examples shown in table 2 and table 4 and in the presence of a corrosion inhibitor (E) no residues on the pad (no discoloration) can be detected.

The invention claimed is:

1. A process, comprising:
chemical mechanical polishing a substrate with a chemical mechanical polishing (CMP) composition,
wherein the substrate comprises: (i) a layer comprising cobalt; (ii) a layer comprising TiN and/or TaN; and (iii) a dielectric layer,
wherein the CMP composition comprises: (A) inorganic particles; (B) an organic compound comprising an amino-group and an acid group, the organic compound comprising n amino groups and at least n+1 acidic protons, wherein n is an integer ≥1; (C) an oxidizer in an amount of from 0.2 to 2.5 wt.-% based on a total weight of the CMP composition; and (D) an aqueous medium,
wherein the CMP composition has a pH of more than 6 and less than 9, and
wherein the chemical mechanical polishing comprises a cobalt material removal rate in a range of from 1000 to 4000 Å/min combined with a TiN and/or TaN material removal rate of at least 200 Å/min.

2. The process of claim 1, wherein the inorganic particles (A) are colloidal inorganic particles.

3. The process of claim 2, wherein the colloidal inorganic particles are colloidal silica particles.

4. The process of claim 1, wherein the organic compound (B) is a non-polymeric compound with a molecular weight below 600 g/mol.

5. The process of claim 1, wherein the acid group in the organic compound (B) comprises a carboxylic acid, sulfonic acid, and/or phosphonic acid.

6. The process of claim 1, wherein the organic compound (B) comprises an amino acid, substituted etyhlenediamine, substituted diethylenetriamine, secondary amine, and/or tertiary amine.

7. The process of claim 1, wherein the total amount of the organic compound (B) is in a range of from 0.1 to 2 wt.-% based on the total weight of the CMP composition.

8. The process of claim 1, wherein the CMP composition further comprises:
a corrosion inhibitor (E) in a total amount of from 0.001 to 0.10 wt.-% based on the total weight of the CMP composition.

9. The process of claim 8, wherein the corrosion inhibitor (F) has a pka-value of below 8.

10. The process of claim 1, wherein the CMP composition further comprises:
a surfactant (F) in a total amount of from 0.001 to 0.05 wt.-% based on the total weight of the CMP composition.

11. The process of claim 10, wherein the surfactant (F) is an amphiphilic non-ionic surfactant comprising a polyoxy alkylene group.

12. The process of claim 1, wherein the oxidizer (C) is hydrogen peroxide.

13. The process of claim 1, wherein the chemical mechanical polishing comprises selectively removing
the layer comprising the cobalt at a first material removal rate in a range of from 1200 to 3900 Å/min,
the layer comprising the TiN and/or TaN is a second material removal rate in a range of from 250 to 700 Å/min, and
a second layer at a third material removal rate between the first and the second material removal rate.

14. The process of claim 1, wherein the dielectric layer comprises $SiO_2$, silicon, a low-k material, an ultra low-k material, or other isolating and semiconducting material.

15. The process of claim 1, wherein the cobalt material removal rate is in the range of from 1200 to 3900 Å/min, and the TiN and/or TaN material removal rate is higher than 300 Å/min.

16. The process of claim 1, wherein the organic compound (B) comprises no more than one amino acid.

17. A process for manufacturing a semiconductor device, the process comprising:
chemical mechanical polishing of a substrate comprising: (i) a layer comprising cobalt; (ii) a layer comprising TiN and/or TaN, and (iii) a dielectric layer;
in the presence of a CMP composition comprising: (A) inorganic particles; (B) an organic compound comprising an amino-group and an acid group (Y), the organic compound comprising n amino groups and at least n+1 acidic protons, wherein n is an integer ≥1; (C) an oxidizer in an amount of from 0.2 to 2.5 wt.-% based on a total weight of the CMP composition; and (D) an aqueous medium,
to obtain a semiconductor device,
wherein the CMP composition has a pH of more than 6 and less than 9, and
wherein the chemical mechanical polishing comprises a cobalt material removal rate in a range of from 1000 to 4000 Å/min combined with a TiN and/or TaN material removal rate of at least 200 Å/min.

18. The process of claim 17, wherein a static etch rate of cobalt is below 70 Å/min.

19. The process of claim 18, wherein the cobalt material removal rate is in the range of from 1200 to 3900 Å/min, and the TiN and/or TaN material removal rate is higher than 300 Å/min.

20. The process of claim 17, wherein the organic compound (B) comprises no more than one amino acid.

* * * * *